US011573320B2

(12) United States Patent
Brady et al.

(10) Patent No.: US 11,573,320 B2
(45) Date of Patent: Feb. 7, 2023

(54) LIGHT RECEIVING ELEMENT AND RANGING MODULE

(71) Applicant: Sony Semiconductor Solutions Corporation, Kanagawa (JP)

(72) Inventors: Frederick Brady, Webster, NY (US); Sungin Hwang, Pittsford, NY (US); Ward van der Tempel, Brussels (BE); Timmermans Michiel, Werchter (BE); Sozo Yokogawa, Kanagawa (JP); Taisuke Suwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1024 days.

(21) Appl. No.: 16/280,307

(22) Filed: Feb. 20, 2019

(65) Prior Publication Data

US 2020/0264308 A1 Aug. 20, 2020

(51) Int. Cl.
| | |
|---|---|
| *G01S 17/08* | (2006.01) |
| *G01S 17/93* | (2020.01) |
| *G06V 20/58* | (2022.01) |
| *G06V 20/64* | (2022.01) |
| *H01L 27/146* | (2006.01) |
| *G01S 17/931* | (2020.01) |

(52) U.S. Cl.
CPC ............ *G01S 17/08* (2013.01); *G01S 17/931* (2020.01); *G06V 20/58* (2022.01); *G06V 20/64* (2022.01); *H01L 27/146* (2013.01)

(58) Field of Classification Search
CPC ...... G01S 17/08; G01S 7/4863; G01S 7/4865; G01S 17/931; G01S 17/894; G06V 20/58; G06V 20/64; H01L 27/146; H01L 27/14643; H01L 27/14609
See application file for complete search history.

(56) References Cited

U.S. PATENT DOCUMENTS

| | | | | |
|---|---|---|---|---|
| 2009/0295979 | A1* | 12/2009 | Matsuo | ............... H01L 27/1464 257/292 |
| 2011/0134295 | A1* | 6/2011 | Shigeta | ................... H03M 1/18 348/300 |

(Continued)

FOREIGN PATENT DOCUMENTS

JP 2004045304 A * 2/2004 ............. G01S 17/36

*Primary Examiner* — Tuyen K Vo
(74) *Attorney, Agent, or Firm* — Sheridan Ross P.C.

(57) ABSTRACT

A light receiving element includes: a first tap; a second tap; a first photoelectric conversion unit configured to detect a charge generated by photoelectric conversion according to a light amount of incident light in accordance with a voltage applied to the first tap; a second photoelectric conversion unit configured to detect a charge generated by photoelectric conversion according to a light amount of the incident light in accordance with a voltage applied to the second tap; a plurality of accumulation units configured to accumulate the charges generated by the first photoelectric conversion unit and the second photoelectric conversion unit; a plurality of transmission units configured to transmit the charges generated by the first photoelectric conversion unit and the second photoelectric conversion unit to the plurality of accumulation units; and a calculation unit configured to execute calculation based on the charges accumulated in the plurality of accumulation units.

20 Claims, 22 Drawing Sheets

(56) References Cited

U.S. PATENT DOCUMENTS

2013/0258311 A1* 10/2013 Mase ................ H01L 27/14609
　　　　　　　　　　　　　　　　　　　　　356/3
2018/0315798 A1* 11/2018 Shimasaki ............ H01L 51/442
2018/0367746 A1* 12/2018 Toda ................. H01L 27/14647
2019/0098224 A1* 3/2019 Kobayashi ............ H01L 27/307

* cited by examiner

FIG. 7
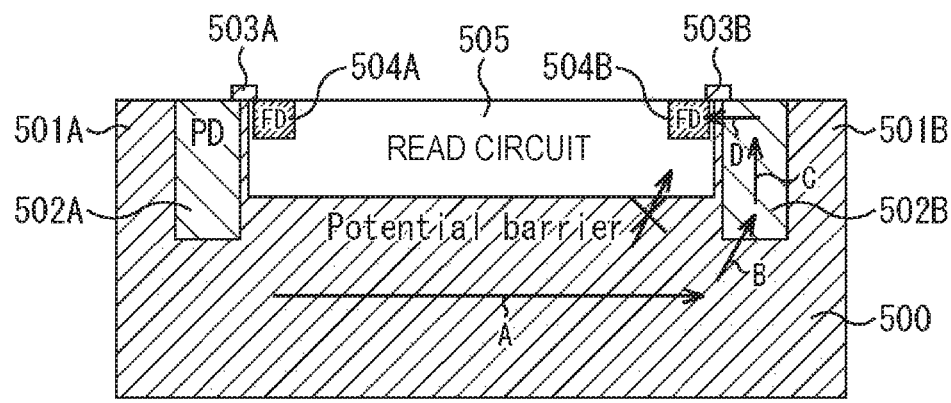
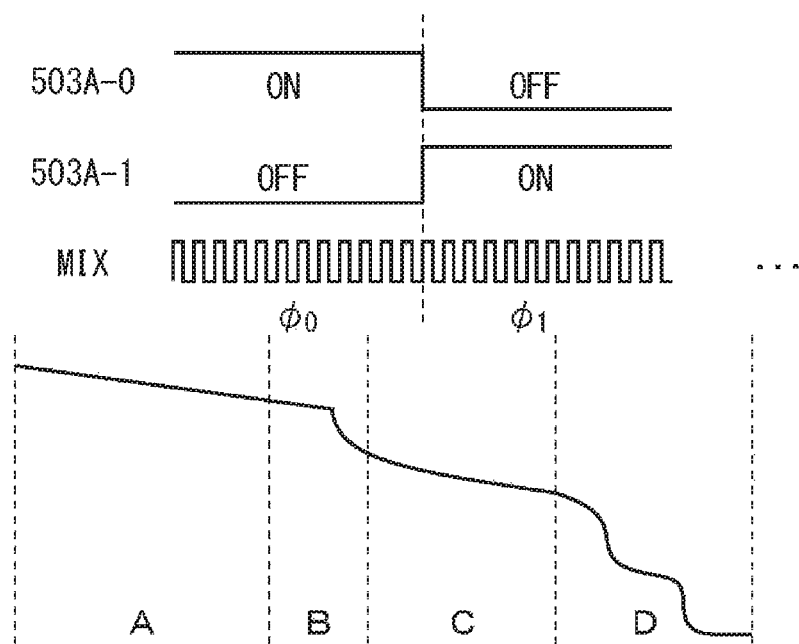

LIGHT RECEIVING ELEMENT AND RANGING MODULE

BACKGROUND

The present disclosure relates to a light receiving element and a ranging module, and more particularly, to a light receiving element and a ranging module capable of measuring distance with high accuracy even in a case in which an object moves fast or the ranging module itself moves at a high speed.

In the related art, a ranging system using an indirect time of flight (ToF) method is known. In such a ranging system, a sensor capable of receiving light reflected from an object due to laser light that repeatedly emits light with a certain pulse width is indispensable.

Therefore, for example, a technique in which a voltage is directly applied to a substrate of a sensor to generate a current in the substrate so that a wide region in the substrate is able to be modulated at a high speed has been proposed (refer to, for example, JP 2011-86904A). Such a sensor is also referred to as a current assisted photonic demodulator (CAPD) sensor.

SUMMARY

Incidentally, in a case of attempting to measure distance of an object by a ranging system using an indirect ToF method, a reciprocating time in which the object is irradiated with active light using an LED or a laser at a predetermined modulation frequency and light reflected by the object is received is measured as a phase shift amount with respect to the modulation frequency, and the distance is calculated on the basis of a measurement result.

However, in a case in which a movement of the object is fast or the ranging system moves, there are concerns that it takes time to acquire information necessary for distance measurement, a distance to the object may be changed, and distance measurement accuracy may be reduced or the distance measurement may not be possible.

In particular, it is desirable to cause a process time related to distance measurement to be high speed so as to measure distance with high accuracy even in a case in which an object moves fast or a ranging module moves at a high speed.

According to an embodiment of the present disclosure, there is provided a light receiving element and a ranging module including: a first tap to which a first voltage is applied; a second tap to which a second voltage different from the first voltage is applied; a first photoelectric conversion unit configured to detect a charge generated by photoelectric conversion according to a light amount of incident light in accordance with a voltage applied to the first tap; a second photoelectric conversion unit configured to detect a charge generated by photoelectric conversion according to a light amount of the incident light in accordance with a voltage applied to the second tap; a plurality of accumulation units configured to accumulate the charges generated by the first photoelectric conversion unit and the second photoelectric conversion unit; a plurality of transmission units configured to transmit the charges generated by the first photoelectric conversion unit and the second photoelectric conversion unit to the plurality of accumulation units; and a calculation unit configured to execute calculation based on the charges accumulated in the plurality of accumulation units, which is the charge of one of the first photoelectric conversion unit and the second photoelectric conversion unit among the charges accumulated in the plurality of accumulation units.

In an embodiment of the present disclosure, a first voltage is applied to a first tap; a second voltage different from the first voltage is applied to a second tap; a first photoelectric conversion unit is configured to detect a charge generated by photoelectric conversion according to a light amount of incident light in accordance with a voltage applied to the first tap; a second photoelectric conversion unit is configured to detect a charge generated by photoelectric conversion according to a light amount of the incident light in accordance with a voltage applied to the second tap; a plurality of accumulation units are configured to accumulate the charges generated by the first photoelectric conversion unit and the second photoelectric conversion unit; a plurality of transmission units are configured to transmit the charges generated by the first photoelectric conversion unit and the second photoelectric conversion unit to the plurality of accumulation units; and calculation based on the charges accumulated in the plurality of accumulation units, which is the charge of one of the first photoelectric conversion unit and the second photoelectric conversion unit among the charges accumulated in the plurality of accumulation units, is executed.

BRIEF DESCRIPTION OF THE DRAWINGS

FIG. 7 is a diagram for explaining a flow of a charge of the pixel of FIG. 6;

DETAILED DESCRIPTION OF THE EMBODIMENT(S)

Figure 1:
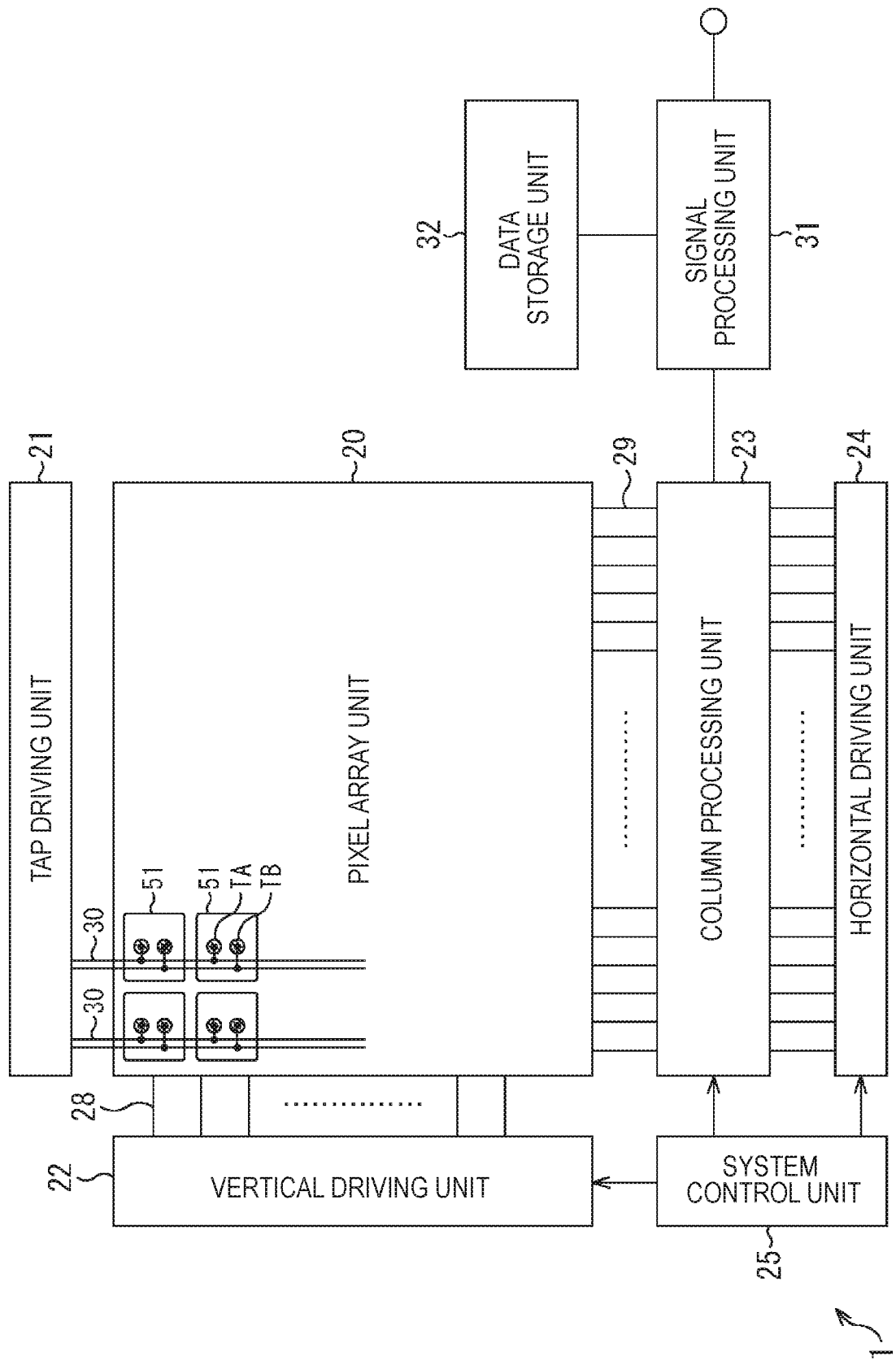
FIG. 1 is a block diagram illustrating a configuration example of a two-dimensional imaging sensor including a light receiving element.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, an embodiment for carrying out the present disclosure (hereinafter, referred to as an embodiment) will be described. The description will be given in the following order.
1. First embodiment
2. Modified example of first embodiment
3. Second embodiment
4. Third embodiment
5. Substrate configuration example of light receiving element
6. Configuration example of ranging module
7. Example of application to moving body Hereinafter, an embodiment to which the present technology is applied will be described with reference to the drawings.

1. First Embodiment

Configuration Example of Light Receiving Element

FIG. 1 is a block diagram for explaining a configuration example of a two-dimensional imaging device including a light receiving element using a CAPD pixel.

The light receiving element 1 shown in FIG. 1 is a CAPD sensor of a rear surface irradiation type, and is provided, for example, in an imaging apparatus having a ranging function.

The light receiving element 1 has a pixel array unit 20 formed on a semiconductor substrate (not shown) and a peripheral circuit unit integrated on the same semiconductor substrate the same as the pixel array unit 20. The peripheral circuit unit includes, for example, a tap driving unit 21, a vertical driving unit 22, a column processing unit 23, a horizontal driving unit 24, and a system control unit 25.

The light receiving element 1 is further provided with a signal processing unit 31 and a data storage unit 32. Note that the signal processing unit 31 and the data storage unit 32 may be mounted on the same substrate as the light receiving element 1 or may be disposed on a substrate separate from the light receiving element 1 in the imaging apparatus.

The pixel array unit 20 has a configuration in which pixels 51 that generate a charge corresponding to a received light amount and output a signal corresponding to the charge are two-dimensionally disposed in a matrix shape of a row direction and a column direction. That is, the pixel array unit 20 has a plurality of pixels 51 that perform photoelectric conversion on incident light and output a signal corresponding to a charge obtained as a result. Here, the row direction refers to an arrangement direction of the pixels 51 in a horizontal direction, and the column direction refers to the arrangement direction of the pixels 51 in a vertical direction. The row direction is a horizontal direction in the figure, and the column direction is a vertical direction in the figure.

The pixel 51 receives light incident from the outside, in particular, infrared light, performs photoelectric conversion on the received light, and outputs a pixel signal according to a charge obtained as a result. The pixel 51 has a first tap TA that detects a charge obtained by the photoelectric conversion by applying a predetermined voltage MIX0 (first voltage), and a second tap TB that detects a charge obtained by the photoelectric conversion by applying a predetermined voltage MIX1 (second voltage).

The tap driving unit 21 supplies the predetermined voltage MIX0 to the first tap TA of each of the pixels 51 of the pixel array unit 20 through a predetermined voltage supply line 30, and supplies the predetermined voltage MIX1 to the second tap TB thereof through the predetermined voltage supply line 30. Therefore, two voltage supply lines 30 including the voltage supply line 30 that transmits the voltage MIX0 and the voltage supply line 30 that transmits the voltage MIX1 are wired to one pixel column of the pixel array unit 20.

In the pixel array unit 20, with respect to the pixel array of the matrix shape, a pixel drive line 28 is wired along a row direction for each pixel row, and two vertical signal lines 29 are wired along a column direction for each pixel column. For example, the pixel drive line 28 transmits a drive signal for driving when reading a signal from the pixel. Note that, although FIG. 1 shows one wire for the pixel drive line 28, the pixel drive line 28 is not limited to one. One end of the pixel drive line 28 is connected to an output end corresponding to each row of the vertical driving unit 22.

The vertical driving unit 22 includes a shift register, an address decoder, or the like. The vertical driving unit 22 drives each pixel of all pixels of the pixel array unit 20 at the same time, or in row units, or the like. That is, the vertical driving unit 22 includes a driving unit that controls operation of each pixel of the pixel array unit 20, together with the system control unit 25 that controls the vertical driving unit 22.

The signals output from each pixel 51 of a pixel row in response to drive control by the vertical driving unit 22 are input to the column processing unit 23 through the vertical signal line 29. The column processing unit 23 performs a predetermined signal process on the pixel signal output from each pixel 51 through the vertical signal line 29 and temporarily holds the pixel signal after the signal process.

Specifically, the column processing unit 23 performs a noise removal process, an analog to digital (AD) conversion process, and the like as the signal process.

The horizontal driving unit 24 includes a shift register, an address decoder, or the like, and sequentially selects unit circuits corresponding to pixel columns of the column processing unit 23. The column processing unit 23 sequentially outputs the pixel signals obtained through the signal process for each unit circuit, by a selective scan by the horizontal driving unit 24.

The system control unit 25 includes a timing generator or the like that generates various timing signals and performs drive control on the tap driving unit 21, the vertical driving unit 22, the column processing unit 23, the horizontal driving unit 24, and the like, on the basis of the various generated timing signals.

The signal processing unit 31 has at least a calculation process function and performs various signal processes such as a calculation process on the basis of the pixel signal output from the column processing unit 23. The data storage unit 32 temporarily stores data necessary for the signal process in the signal processing unit 31.

Outline of Pixel in CAPD Sensor

Next, the outline of the pixel provided in the pixel array unit 20 configuring the CAPD sensor will be described. For example, the pixel provided in the pixel array unit 20 is configured as shown in FIG. 2.

Figure 2:
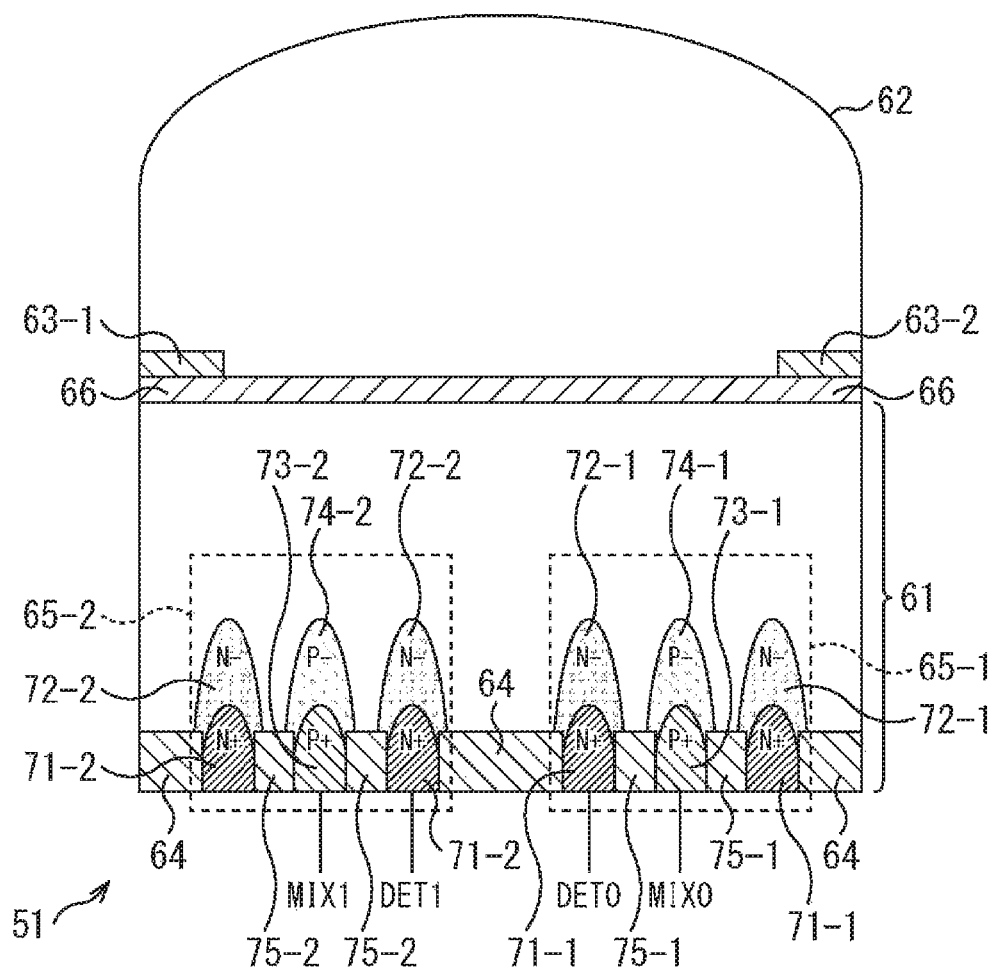
FIG. 2 is a diagram illustrating a configuration example of a CAPD type pixel of the related art.

FIG. 2 illustrates a cross section of one pixel 51 provided in the pixel array unit 20. The pixel 51 receives light incident from the outside, in particular, infrared light, performs photoelectric conversion on the incident light, and outputs a signal according to a charge obtained as a result.

For example, the pixel 51 has a substrate 61 including a P-type semiconductor layer such as a silicon substrate, and an on-chip lens 62 formed on the substrate 61.

For example, a thickness of the substrate 61 in a vertical direction in the drawing, that is, the thickness in a direction perpendicular to a surface of the substrate 61, is set to be 20 μm or less. Note that it is a matter of course that the thickness of the substrate 61 may be 20 μm or more, and it is sufficient if the thickness of the substrate 61 is determined according to a targeted characteristic and the like of the light receiving element 1.

In addition, the substrate 61 is a P-Epi substrate or the like having a high resistance, for example, having a substrate concentration on the order of 1E+13 or less, and the resistance (resistivity) of the substrate 61 is set to be, for example, 300 [Ωcm] or more.

Here, a relationship between the substrate concentration and the resistance of the substrate 61 is, for example, a resistance of 2000 [Ωcm] when the substrate concentration is 6.48E+12 [cm$^3$], a resistance of 1000 [Ωcm] when the substrate concentration is 1.30E+13 [cm$^3$], a resistance of 500 [Ωcm] when the substrate concentration is 2.59E+13 [cm$^3$], a resistance of 100 [Ωcm] when the substrate concentration is 1.30E+14 [cm$^3$], and the like.

In FIG. 2, an upper surface of the substrate 61 is the rear surface of the substrate 61, and is a light incident surface of the substrate 61 on which the light from the outside is incident. On the other hand, a lower surface of the substrate 61 is a surface of the substrate 61, and a multilayer wiring layer (not shown) is formed thereon. A protection film that electrically and chemically protects the semiconductor surface is formed on the surface of the substrate 61.

Furthermore, in the pixel 51, at an end portion of the pixel 51 on the protection film, an inter-pixel light shielding film 63-1 and an inter-pixel light shielding film 63-2 for preventing crosstalk between adjacent pixels are formed. Hereinafter, in a case in which it is not necessary to particularly distinguish between the inter-pixel light shielding film 63-1 and the inter-pixel light shielding film 63-2, the inter-pixel light shielding film 63-1 and the inter-pixel light shielding film 63-2 are also simply referred to as an inter-pixel light shielding film 63.

In this example, the light from the outside enters the inside of the substrate 61 through the on-chip lens 62, but the inter-pixel light shielding film 63 is formed to cause the light incident from the outside not to enter a region of another pixel that is provided adjacent to the pixel 51 on the substrate 61. That is, the light entering the on-chip lens 62 from the outside and proceeding to the other pixel adjacent to the pixel 51 is shielded by the inter-pixel light shielding film 63-1 and the inter-pixel light shielding film 63-2, and thus it is prevented from entering another adjacent pixel.

Since the light receiving element 1 is a CAPD sensor of a rear surface illuminated type, the light incident surface of the substrate 61 is a so-called rear surface, and a wiring layer including a wiring or the like is not formed on the rear surface. In addition, a wiring layer in which a wiring for driving a transistor and the like formed in the pixel 51, a wiring for reading the signal from the pixel 51, and the like are formed is formed by stacking on a portion of a surface of the substrate 61 opposite to the light incident surface.

An oxide film 64, a signal extraction unit 65-1, and a signal extraction unit 65-2 are formed on the surface opposite to the light incident surface in the substrate 61, that is, in an inside portion of the lower surface in the figure. The signal extraction unit 65-1 corresponds to the first tap TA described in FIG. 1, and the signal extraction unit 65-2 corresponds to the second tap TB described in FIG. 1.

In this example, the oxide film 64 is formed in a central portion of the pixel 51 in the vicinity of the surface opposite to the light incident surface of the substrate 61, and the signal extraction unit 65-1 and the signal extraction unit 65-2 are formed at both ends of the oxide film 64, respectively.

Here, the signal extraction unit 65-1 has an N+ semiconductor region 71-1 and an N− semiconductor region 72-1 having a donor impurity concentration lower than that of the N+ semiconductor region 71-1 which are an N type semiconductor region, and a P+ semiconductor region 73-1 and a P+ semiconductor region 74-1 having an acceptor impurity concentration lower than that of the P+ semiconductor region 73-1 which are a P type semiconductor region. Here, an example of a donor impurity with respect to Si may include an element belonging to group 5 in the periodic table of the elements, such as phosphorus (P) or arsenic (As), and an example of an acceptor impurity with respect to Si may include an element belonging to group 3 in the periodic table of the elements, such as boron (B). An element serving as the donor impurity is referred to as a donor element, and an element serving as the acceptor impurity is referred to as an acceptor element.

In FIG. 2, the N+ semiconductor region 71-1 is formed at a position adjacent to a right side of the oxide film 64 in a surface inside portion of the surface opposite to the light incident surface of the substrate 61. In addition, the N− semiconductor region 72-1 is formed above the N+ semiconductor region 71-1 in the figure to cover (surround) the N+ semiconductor region 71-1.

Furthermore, the P+ semiconductor region 73-1 is formed on a right side of the N+ semiconductor region 71-1. In addition, the P− semiconductor region 74-1 is formed above the P+ semiconductor region 73-1 in the figure to cover (surround) the P+ semiconductor region 73-1.

Furthermore, the N+ semiconductor region 71-1 is formed on a right side of the P+ semiconductor region 73-1. In addition, the N− semiconductor region 72-1 is formed above the N+ semiconductor region 71-1 in the figure to cover (surround) the N+ semiconductor region 71-1.

Similarly, the signal extraction unit 65-2 has an N+ semiconductor region 71-2 and an N− semiconductor region 72-2 having a donor impurity concentration lower than that of the N+ semiconductor region 71-2 which are an N type semiconductor region, and a P+ semiconductor region 73-2 and a P− semiconductor region 74-2 having an acceptor impurity concentration lower than that of the P+ semiconductor region 73-2 which are a P type semiconductor region.

In FIG. 2, the N+ semiconductor region 71-2 is formed at a position adjacent to a left side of the oxide film 64 in the surface inside portion of the surface opposite to the light incident surface of the substrate 61. In addition, the N− semiconductor region 72-2 is formed above the N+ semiconductor region 71-2 in the figure to cover (surround) the N+ semiconductor region 71-2.

Furthermore, the P+ semiconductor region 73-2 is formed on a left side of the N+ semiconductor region 71-2. In addition, the P− semiconductor region 74-2 is formed above the P+ semiconductor region 73-2 in the figure to cover (surround) the P+ semiconductor region 73-2.

Furthermore, the N+ semiconductor region 71-2 is formed on a left side of the P+ semiconductor region 73-2. In addition, the N− semiconductor region 72-2 is formed above the N+ semiconductor region 71-2 in the figure to cover (surround) the N+ semiconductor region 71-2.

An oxide film 64 similar to that of the central portion of the pixel 51 is formed at the end portion of the pixel 51 in the surface inside portion of the surface opposite to the light incident surface of the substrate 61.

Hereinafter, in a case in which it is not necessary to particularly distinguish between the signal extraction unit 65-1 and the signal extraction unit 65-2, the signal extraction unit 65-1 and the signal extraction unit 65-2 are also simply referred to as a signal extraction unit 65.

In addition, hereinafter, in a case in which it is not necessary to particularly distinguish between the N+ semiconductor region 71-1 and the N+ semiconductor regions 71-2, the N+ semiconductor region 71-1 and the N+ semiconductor regions 71-2 are also simply referred to as an N+ semiconductor region 71, and in a case in which it is not necessary to particularly distinguish between the N− semiconductor region 72-1 and the N− semiconductor region 72-2, the N− semiconductor region 72-1 and the N− semiconductor region 72-2 are also simply referred to as an N− semiconductor region 72.

Furthermore, hereinafter, in a case in which it is not necessary to particularly distinguish between the P+ semiconductor region 73-1 and the P+ semiconductor region 73-2, the P+ semiconductor region 73-1 and the P+ semiconductor region 73-2 are also simply referred to as a P+ semiconductor region 73, and in a case in which it is not necessary to particularly distinguish between the P− semiconductor region 74-1 and the P− semiconductor region 74-2, the P− semiconductor region 74-1 and the P− semiconductor region 74-2 are also simply referred to as a P− semiconductor region 74.

In addition, in the substrate 61, a separation portion 75-1 for separating between the N+ semiconductor region 71-1 and the P+ semiconductor region 73-1 is formed between the N+ semiconductor region 71-1 and the P+ semiconductor region 73-1, using an oxide film or the like. Similarly, a separation portion 75-2 for separating between the N+ semiconductor region 71-2 and the P+ semiconductor region 73-2 is formed between the N+ semiconductor region 71-2 and the P+ semiconductor region 73-2, using an oxide film or the like. Hereinafter, in a case in which it is not necessary to particularly distinguish between the separation portion 75-1 and the separation portion 75-2, the separation portion 75-1 and the separation portion 75-2 are also simply referred to as a separation portion 75.

The N+ semiconductor region 71 provided on the substrate 61 functions as a charge detection unit for detecting a light amount of the light incident on the pixel 51 from the outside, that is, an amount of a signal carrier generated by the photoelectric conversion by the substrate 61. Note that, in addition to the N+ semiconductor region 71, the N− semiconductor region 72 having a low donor impurity concentration is also able to be regarded as the charge detection unit. In addition, the P+ semiconductor region 73 functions as a voltage applying unit for injecting a majority carrier current into the substrate 61, that is, applying a voltage directly to the substrate 61 to generate an electric field in the substrate 61. Note that, in addition to the P+ semiconductor region 73, the P− semiconductor region 74 having a low acceptor impurity concentration is also able to be regarded as a voltage applying unit.

In the pixel 51, a floating diffusion (FD) portion that is a floating diffusion region (not shown) (hereinafter, also referred to particularly as FD portion A) is connected to the N+ semiconductor region 71-1 through a transmission transistor (not shown). In addition, the FD portion A is connected to the vertical signal line 29 through an amplification transistor (not shown) or the like.

Similarly, an FD portion (hereinafter, also referred to particularly as FD portion B) that is different from the FD portion A is directly connected to the N+ semiconductor region 71-2. In addition, the FD portion B is connected to the vertical signal line 29 through an amplification transistor (not shown) or the like. Here, the FD portion A and the FD portion B are connected to different vertical signal lines 29.

For example, in a case of attempting to measure the distance to the object by an indirect ToF method, infrared light is emitted from the imaging apparatus provided with the light receiving element 1 toward the object. In addition, in a case in which the infrared light is reflected by the object and returns to the imaging apparatus as reflected light, the substrate 61 of the light receiving element 1 receives the reflected light (infrared light) incident thereon and performs photoelectric conversion. The tap driving unit 21 drives the first tap TA and the second tap TB of the pixel 51, and distributes a signal according to a charge DET obtained by the photoelectric conversion to the FD portion A and the FD portion B.

For example, at a certain timing, the tap driving unit 21 applies a voltage to the two P+ semiconductor regions 73 through a contact or the like. Specifically, for example, the tap driving unit 21 applies a voltage of MIX0=1.5 V to the P+ semiconductor region 73-1 that is the first tap TA and applies a voltage of MIX1=0 V to the P+ semiconductor region 73-2 that is the second tap TB.

Then, an electric field is generated between the two P+ semiconductor regions 73 in the substrate 61, and a current flows from the P+ semiconductor region 73-1 to the P+ semiconductor region 73-2. In this case, a hole in the substrate 61 moves toward the P+ semiconductor region 73-2, and an electron moves toward the P+ semiconductor region 73-1.

Therefore, in such a state, in a case in which the infrared light (reflected light) from the outside enters the inside of the substrate 61 through the on-chip lens 62, and the photoelectric conversion is performed on the infrared light in the substrate 61 to convert the infrared light into pairs of electrons and holes, the obtained electrons are guided toward the P+ semiconductor region 73-1 by the electric field between the P+ semiconductor regions 73, and are moved to the N+ semiconductor region 71-1.

In this case, the electrons generated by the photoelectric conversion are used as the signal carrier for detecting the signal according to an amount of the infrared light incident on the pixels 51, that is, a reception light amount of the infrared light.

Therefore, a charge according to the electron that is moved to the semiconductor region 71-1 is accumulated in the N+ semiconductor region 71-1, and the charge is detected by the column processing unit 23 through the FD portion A, the amplification transistor, the vertical signal line 29, or the like.

That is, an accumulated charge DET0 of the N+ semiconductor region 71-1 is transmitted to the FD portion A that is connected to the N+ semiconductor region 71-1 through the transmission transistor, and the signal according to the charge DET0 transmitted to the FD portion A is read by the column processing unit 23 through the amplification transistor or the vertical signal line 29. In addition, a process such as the AD conversion process in the column processing unit 23 is executed on the read signal, and a pixel signal obtained as a result is supplied to the signal processing unit 31.

The pixel signal is a signal indicating an amount the charge according to the electron detected by the N+ semiconductor region 71-1, that is, an amount of the charge DET0 accumulated in the FD portion A. In other words, it is able to be said that the pixel signal is a signal indicating the light amount of the infrared light received by the pixel 51.

Note that, at this time, a pixel signal according to the electron detected in the N+ semiconductor region 71-2 is also able to be used for appropriate distance measurement, similarly to a case of the N+ semiconductor region 71-1.

In addition, at the next timing, a voltage is applied to the two P+ semiconductor regions 73 through a contact or the like by the tap driving unit 21 so that an electric field in a direction opposite to that of the electric field which has been generated in the substrate 61 so far is generated. Specifically, for example, a voltage of MIX0=0 V is applied to the P+ semiconductor region 73-1 that is the first tap TA, and a voltage of MIX1=1.5 V is applied to the P+ semiconductor region 73-2 that is the second tap TB.

Therefore, an electric field is generated between the two P+ semiconductor regions 73 in the substrate 61, and a current flows from the P+ semiconductor region 73-2 to the P+ semiconductor region 73-1.

In such a state, in a case in which the infrared light (reflected light) from the outside enters the inside of the substrate 61 through the on-chip lens 62, and the photoelectric conversion is performed on the infrared light in the substrate 61 to convert the infrared light into a pair of the electron and the hole, the obtained electron is directed in the direction of P+ semiconductor region 73-2 by the electric field between the P+ semiconductor regions 73, and is moved into the N+ semiconductor region 71-2.

Therefore, a charge according to the electron that is moved to the semiconductor region 71-2 is accumulated in the N+ semiconductor region 71-2, and the charge is detected by the column processing unit 23 through the FD portion B, the amplification transistor, the vertical signal line 29, or the like.

That is, an accumulated charge DET1 of the N+ semiconductor region 71-2 is transmitted to the FD portion B that is directly connected to the N+ semiconductor region 71-2, and the signal according to the charge DET1 transmitted to the FD portion B is read by the column processing unit 23 through the amplification transistor or the vertical signal line 29. In addition, a process such as the AD conversion process in the column processing unit 23 is executed on the read signal, and a pixel signal obtained as a result is supplied to the signal processing unit 31.

Note that, at this time, a pixel signal according to the electron detected in the N+ semiconductor region 71-1 is also able to be used for appropriate distance measurement, similarly to a case of the N+ semiconductor region 71-2.

As described above, in a case in which the pixel signals obtained by the photoelectric conversion of periods different from each other in the same pixel 51 are obtained, the signal processing unit 31 calculates distance information indicating the distance to the object on the basis of the pixel signals and outputs the distance information to the subsequent stage.

A method of distributing the signal carriers to the N+ semiconductor regions 71 different from each other and calculating the distance information on the basis of the signal according to the signal carrier as described above is referred to as an indirect ToF method.

Figure 3:
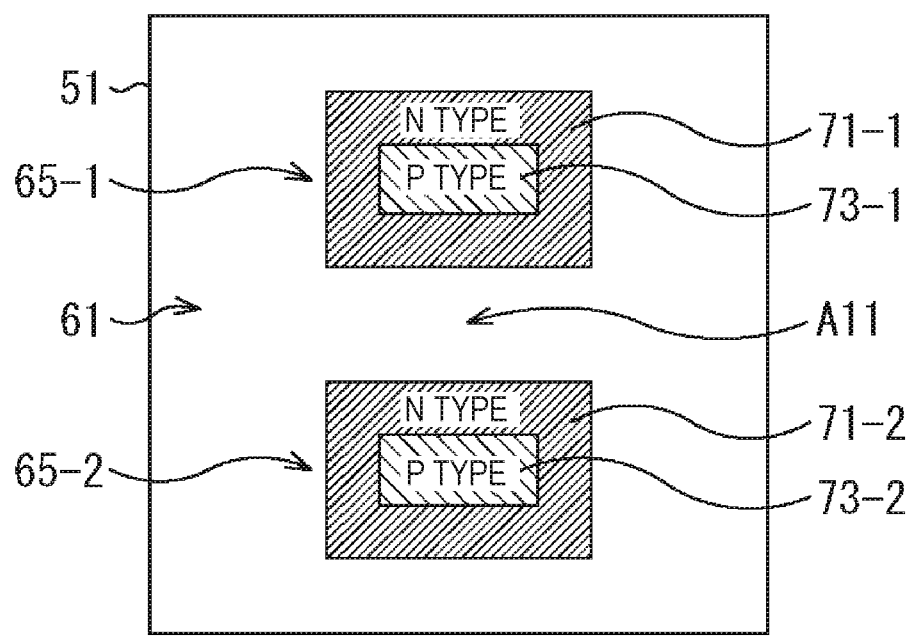
FIG. 3 is a schematic plan view illustrating a configuration example of a portion of a signal extraction unit of a CAPD type pixel.

When seen in a direction from a top to a bottom of the signal extraction unit 65 in the pixel 51 of FIG. 2, that is, in a direction perpendicular to the surface of the substrate 61, for example, as shown in FIG. 3, a periphery of the P+ semiconductor region 73 is surrounded by the N+ semiconductor region 71. Note that, in FIG. 3, portions corresponding to those in FIG. 2 are denoted by the same reference numerals, and description thereof will be omitted as appropriate.

In the example shown in FIG. 3, an oxide film 64 (not shown) is formed in the central portion of the pixel 51, and the signal extraction unit 65 is formed in a portion slightly on an end side from the center of the pixel 51. In particular, here, two signal extraction units 65 are formed in the pixel 51.

In addition, in the signal extraction unit 65, the P+ semiconductor region 73 is formed in a rectangular shape in a central position of the signal extraction unit 65, the periphery of the P+ semiconductor region 73 is surrounded by the N+ semiconductor region 71 of a rectangular shape, in more detail, by a rectangular frame shape around a center of the P+ semiconductor region 73 of the signal extraction unit 65. That is, the N+ semiconductor region 71 is formed to surround the periphery of the P+ semiconductor region 73.

In addition, in the pixel 51, the on-chip lens 62 is formed so as to condense the infrared light incident from the outside at the central portion of the pixel 51, that is, a portion shown by an arrow A11. In other words, the infrared light incident on the on-chip lens 62 from the outside is condensed by the on-chip lens 62 to the position shown by the arrow A11, that is, an upper side in FIG. 2 of the oxide film 64 in FIG. 2.

Therefore, the infrared light is condensed to a position between the signal extraction unit 65-1 and the signal extraction unit 65-2. Thus, it is possible to suppress crosstalk due to the infrared light incident on the pixel adjacent to the pixel 51 and it is also possible to suppress the infrared light from directly entering the signal extraction unit 65.

For example, in a case in which the infrared light directly enters the signal extraction unit 65, charge separation efficiency, that is, modulation contrast between active and inactive tap (Cmod) is reduced.

Here, the signal extraction unit 65 in which the reading of the signal according to the charge DET that is obtained by the photoelectric conversion is to be performed, that is, the signal extraction unit 65 in which the charge DET obtained by the photoelectric conversion is to be detected will be referred to as an active tap.

On the contrary, basically, the signal extraction unit 65 in which the reading of the signal according to the charge DET that is obtained by the photoelectric conversion is not to be performed, that is, the signal extraction unit 65 that is not the active tap will be referred to as an inactive tap.

In the above example, the signal extraction unit 65 in which a voltage of 1.5 V is applied to the P+ semiconductor region 73 is the active tap, and the signal extraction unit 65 in which a voltage of 0 V is applied to the P+ semiconductor region 73 is the inactive tap.

Cmod is calculated by the following Math. (1), and Cmod indicates that what % of the charge is able to be detected in the N+ semiconductor region 71 of the signal extraction unit 65 that is the active tap, among the charges generated by the photoelectric conversion of the incident infrared light, that is, an index indicating whether or not it is possible to extract the signal according to the charge, and indicates the charge separation efficiency. In Math. (1), I0 is a signal detected in one of two charge detection units (P+ semiconductor regions 73), and I1 is a signal detected in the other of the two charge detection units.

$$Cmod = \{|I0-I1|/(I0+I1)\} \times 100 \qquad (1)$$

Therefore, for example, in a case in which the infrared light incident from the outside is incident on a region of the inactive tap and the photoelectric conversion is performed in the inactive tap, there is a high likelihood that the electron that is the signal carrier generated by the photoelectric conversion will move to the N+ semiconductor region 71 in the inactive tap. Therefore, a charge of a part of the electron obtained by the photoelectric conversion is not detected in the N+ semiconductor region 71 in the active tap, and Cmod, that is, the charge separation efficiency, is reduced.

Therefore, in the pixel 51, the infrared light is condensed in the vicinity of the central portion of the pixel 51 positioned at substantially the same distance from the two signal extraction units 65, so that a possibility that the photoelectric conversion will be performed on the infrared light incident from the outside in the region of the inactive tap is reduced. Thus, it is possible to improve the charge separation efficiency. In addition, in the pixel 51, it is also possible to improve a modulation contrast. In other words, it is possible to easily guide the electron obtained by the photoelectric conversion to the N+ semiconductor region 71 in the active tap.

Distance Measurement Method of Indirect ToF Method

Figure 4:
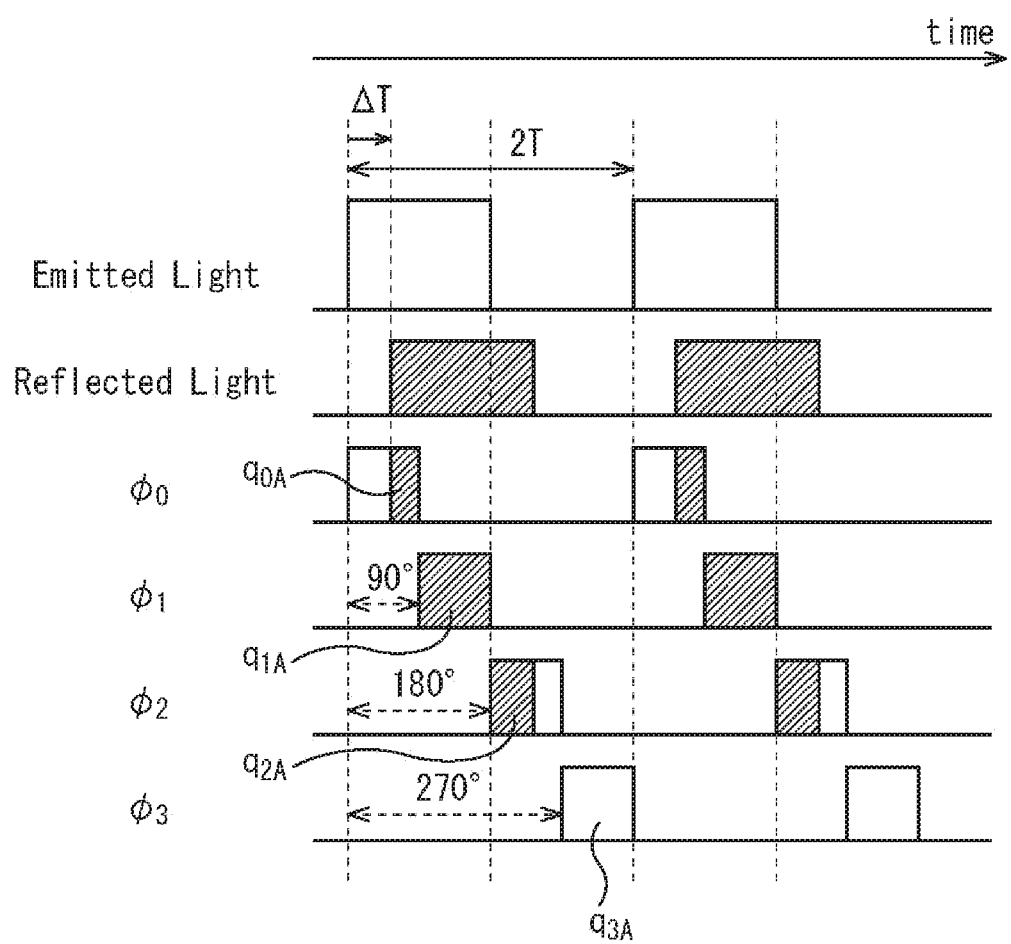
FIG. 4 is a diagram for explaining a distance measurement method of an indirect ToF method.

FIG. 4 is a timing chart for explaining a detection method by four phases (four phase method), in the ToF sensor by the indirect ToF method using the light receiving element 1 including the CAPD sensor as described above.

Irradiation light modulated (1 period=2T) so as to repeat irradiation on/off at an irradiation time T is output from a predetermined light source, and in the light receiving element 1, only a time ΔT according to the distance to the object is delayed, and the reflected light is received.

In the four phase method, the light receiving element 1 receives light at 4 timings of the same phase (that is, Phase0) as that of the irradiation light, a phase shifted by 90 degrees (Phase90), a phase shifted by 180 degrees (Phase180), and a phase shifted by 270 degrees (Phase270), at one of the first tap TA and the second tap TB.

In the four phase method, it is assumed that signal values detected at Phase0, Phase90, Phase180, and Phase270 of the first tap TA are $q_{0A}$, $q_{1A}$, $q_{2A}$, and $q_{3A}$, respectively.

It is possible to detect a phase shift amount θ corresponding to the delay time ΔT by a distribution ratio between the signal values $q_{0A}$, $q_{1A}$, $q_{2A}$, and $q_{3A}$. That is, since the delay time ΔT is obtained on the basis of the phase shift amount θ, the distance to the object is able to be obtained by the delay time ΔT.

The distance to the object is calculated, for example, by the following Math. (2).

$$\text{Distance} = \frac{C \cdot \Delta T}{2} = \frac{C \cdot \alpha}{4\pi f_{mod}} \qquad (2)$$

$$\alpha = \arctan\left(\frac{\phi_1 - \phi_3}{\phi_0 - \phi_2}\right)$$

Here, C is a speed of light, ΔT is the delay time, $f_{mod}$ is the modulation frequency of the light, φ0 to φ3 are the signal values $q_{0A}$, $q_{1A}$, $q_{2A}$, and $q_{3A}$ detected at Phase0, Phase90, Phase180, and Phase270, respectively.

However, as described above, in a case in which the signal values $q_{0A}$, $q_{1A}$, $q_{2A}$, and $q_{3A}$ are obtained and the phase shift amount θ corresponding to the delay time ΔT is obtained by the distribution ratio, the signal values $q_{0A}$, $q_{1A}$, $q_{2A}$, and $q_{3A}$ are obtained at respective timings for the four phases, and then the distribution ratio of each signal is obtained to calculate the phase shift amount θ.

Figure 5:
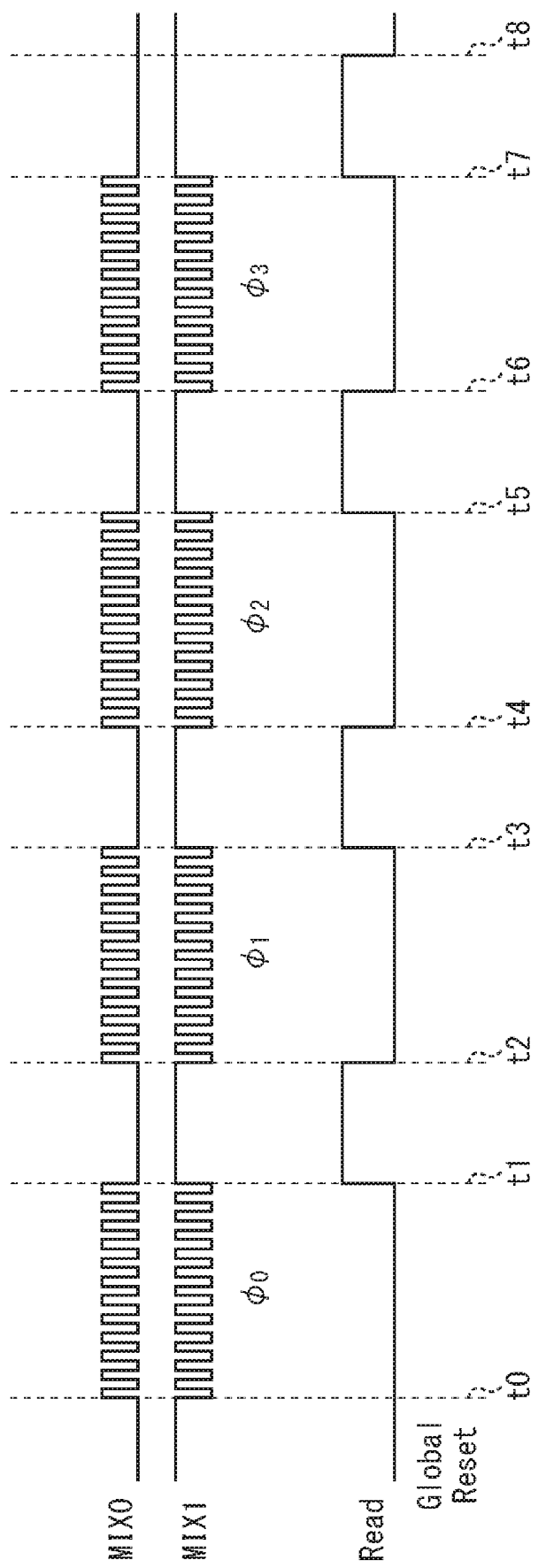
FIG. 5 is a timing chart for explaining operation in the distance measurement of the indirect ToF method in the pixel of FIG. 2.

That is, as shown by the uppermost waveform and a waveform of a second stage of FIG. 5, in a period of time t0 to t1, voltages of 0 V and 1.5 V are alternately applied to the P+ semiconductor regions 73-1 and 73-2 that is the first tap TA, as MIX0 and MIX1, so that the voltages have reverse phases, and a charge corresponding to the signal value $q_{0A}$ of the same phase Phase0 (φ1) as the irradiation light is accumulated. Then, as shown by the lowermost waveform of FIG. 5, in time t1 to t2, the signal processing unit 31 reads the accumulated charge (Read) and calculates the signal value $q_{0A}$.

Similarly, in a period of time t2 to t3, a charge corresponding to the signal value $q_{1A}$ of the phase Phase90 (φ2) advanced by 90 degrees from the irradiation light is accumulated, and then, in time t3 to t4, the signal processing unit 31 reads the accumulated charge (Read) and calculates the signal value $q_{1A}$.

In addition, in a period of time t4 to t5, a charge corresponding to the signal value $q_{2A}$ of the phase Phase180 (φ3) advanced by 180 degrees from the irradiation light is accumulated, and then, in time t5 to t6, the signal processing unit 31 reads the accumulated charge (Read) and calculates the signal value $q_{2A}$.

Furthermore, in a period of time t6 to t7, a charge corresponding to the signal value $q_{3A}$ of the phase Phase270 (φ4) advanced by 270 degrees from the irradiation light is accumulated, and then, in time t7 to t8, the signal processing unit 31 reads the accumulated charge (Read) and calculates the signal value q3A. Up to these processes, since the signal values $q_{0A}$, $q_{1A}$, $q_{2A}$, and $q_{3A}$ of four phases are obtained, the signal processing unit 31 obtains the distance to the object on the basis of the obtained signal values $q_{0A}$, $q_{1A}$, $q_{2A}$, and $q_{3A}$ of the four phases.

That is, when calculating the signal values of four phases, a time for accumulating the charges of four times at each of the phases and a four times signal read time for reading the signal values of each of the phases are necessary, and a distance measurement process of a ranging sensor is possible for the first time after obtaining them.

As a result, in a case in which distance measurement of the object that moves fast is performed, since there is a possibility that the object has already moved to another position while acquiring respective phase data, there is a possibility that a distance measurement result different from an actual state is obtained.

Therefore, each pixel of the light receiving element 1 of an embodiment of the present disclosure includes the floating diffusion layer (FD) that accumulates the charges of each of the four phases, and in obtaining the phase shift amount θ, after accumulating the charges to the FDs of each of the four phases, the accumulated signal values $q_{0A}$, $q_{1A}$, $q_{2A}$, and $q_{3A}$ of the four phases are read in consecutive read periods. Therefore, since it is possible to make the number of readouts required four times as one consecutive readout, it is possible to shorten a time difference between the phases, and it is possible to suppress a movement of a subject related to distance measurement or to minimize an influence of a shake of an imaging system.

Configuration Example of Pixel of Light Receiving Element of Embodiment of the Present Disclosure Next, a configuration example of the pixel 51 of the light receiving element 1 of an embodiment of the present disclosure will be described with reference to FIG. 6. In addition, in FIG. 6, a top view of the pixel 51 is shown in an upper stage, a sectional view is shown in a middle stage, and a potential distribution of each layer is shown in a lower stage.

Figure 6:
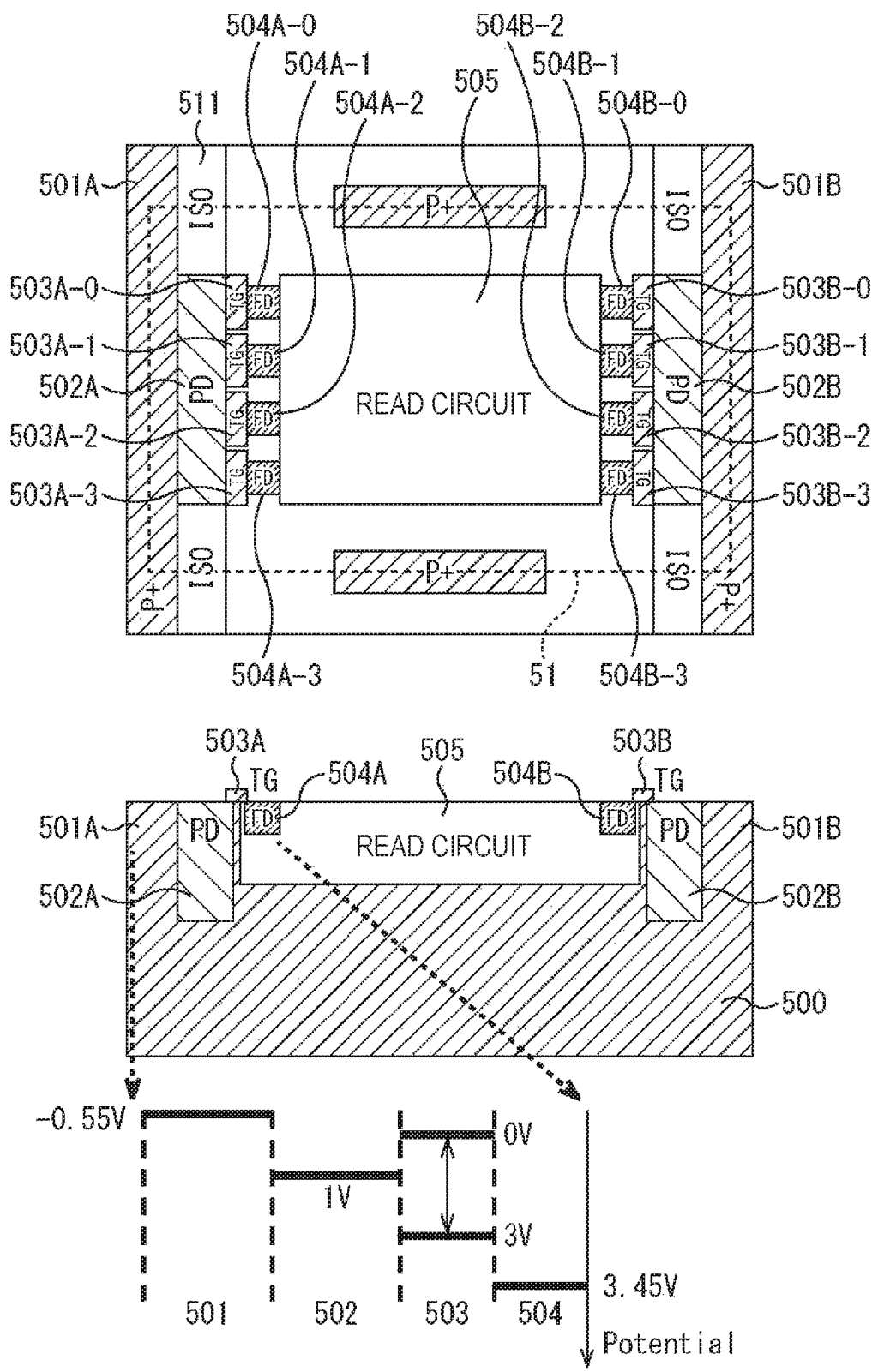
FIG. 6 is a diagram for explaining a layout configuration example of a first embodiment of a pixel configuring the light receiving element of the present disclosure.

The pixel 51 of FIG. 6 is formed on a substrate 500 including a P− semiconductor region, and P+ semiconductor regions 501A and 501B are provided on left and right sides in the figure, and photodiodes (PDs) 502A and 502B that generate charges by the photoelectric conversion corresponding to the received light amount of the infrared light in FIG. 2 are provided at insides of the P+ semiconductor regions 501A and 501B.

In addition, in the sectional view of the middle stage of FIG. 6, an upper portion in the figure is a front surface and a lower portion is a rear surface. In addition, the incident light that is reflected light enters from a bottom in the middle stage of FIG. 6. That is, the pixel 51 of FIG. 6 is a pixel structure of rear surface irradiation type. In addition, in FIG. 6, illustration of the configuration of the on-chip lens 62 and the like in FIG. 2 is omitted.

The P+ semiconductor regions 501A and 501B are configuration components corresponding to the P+ semiconductor regions 73-1 and 73-2, that is, the first tap TA and the second tap TB, and the voltages MIX0 and MIX1 are applied to P+ semiconductor regions 501A and 501B by the voltage supply line 30, respectively.

In a case in which a voltage is applied to the P+ semiconductor region 501A and thus the P+ semiconductor region 501A becomes the active tap, the PD 502A outputs a charge generated by the photoelectric conversion according to the light amount of the light incident on the substrate 500 corresponding to the substrate 61, to transmission transistors 503A-0 to 503A-3.

Similarly, in a case in which a voltage is applied to the P+ semiconductor region 501B and thus the P+ semiconductor region 501B becomes the active tap, the PD 502B outputs a charge generated by the photoelectric conversion according to the light amount of the light incident on the substrate 500 corresponding to the substrate 61, to transmission transistors 503B-0 to 503B-3.

FDs 504A-0 to 504A-3 are connected inside to the PD 502A through the transmission transistors (TG) 503A-0 to 503A-3 from a top in the figure.

FDs 504B-0 to 504B-3 are connected to inside the PD 502B through the transmission transistors (TG) 503B-0 to 503B-3 from the top in the figure.

That is, the transmission transistors 503A-0 to 503A-3 and 503B-0 to 503B-3 are switched on or off according to the timings of each of the phases described with reference to FIG. 4, and the transmission transistors 503A-0 to 503A-3 and 503B-0 to 503B-3 distribute and accumulate charges generated by the photoelectric conversion by the PDs 502A and 502B to and in each of the FDs 504A-0 to 504A-3 and 504B-0 to 504B-3.

A read circuit 505 reads the charges accumulated in the FD 504 in the FDs 504A-0 to 504A-3 and 504B-0 to 504B-3. The signal processing unit 31 obtains the signal values of each of the phases on the basis of the charges that have been read, and calculates a distance in pixel units from the phase shift amount on the basis of the signal values of each of the phases.

That is, also in the pixel 51 of FIG. 6, by switching the voltages applied to the P+ semiconductor regions 501A and 501B, the P+ semiconductor regions 501A and 501B are driven as the first tap TA and the second tap TB. The signals according to the charges DET obtained by the photoelectric conversion supplied by each of the PDs 502A and 502B are allocated and transmitted to each of the FDs 504A-0 to 504A-3 and 504B-0 to 504B-3 by controlling turning on or off of the transmission transistors 503A-0 to 503A-3 and 503B-0 to 503B-3 at the timings of each of the phases Phase0 (φ1), Phase90 (φ2), Phase180 (φ3), and Phase270 (φ4).

For example, in a case in which the voltages MIX0 and MIX1 of 1.5 V and 0 V are alternately applied to the P+ semiconductor region 501A, at the timing of the phase Phase0 (φ1), the charge corresponding to the signal value $q_{0A}$ is accumulated in the FD 504A-0, by controlling the transmission transistor 503A-0 among the transmission transistors 503A-0 to 503A-3 to be turned on and controlling the others to be turned off.

In addition, at the timing of the phase Phase90 (φ1), the charge corresponding to the signal value $q_{1A}$ is accumulated in the FD 504A-1, by controlling the transmission transistor 503A-1 among the transmission transistors 503A-0 to 503A-3 to be turned on and controlling the others to be turned off.

Furthermore, at the timing of the phase Phase180 (φ2), the charge corresponding to the signal value $q_{2A}$ is accumulated in the FD 504A-2, by controlling the transmission transistor 503A-2 among the transmission transistors 503A-0 to 503A-3 to be turned on and controlling the others to be turned off.

In addition, at the timing of the phase Phase270 (φ3), the charge corresponding to the signal value $q_{3A}$ is accumulated in the FD 504A-3, by controlling the transmission transistor 503A-3 among the transmission transistors 503A-0 to 503A-3 to be turned on and controlling the others to be turned off.

In addition, in a case in which the PD 502B on a right side in the figure functions as the active tap and the PD 502A functions as the inactive tap by applying the voltage of 1.5 V to the P+ semiconductor region 501B and the voltage of, for example, −0.55 V to the semiconductor region 501A, as shown in the middle stage of FIG. 6, the potential distributions in each of the P+ semiconductor region 501A, the PD 502A, the transmission transistor 503A, and the FD 504A on a left side in the figure become, for example, a relationship shown in the lower stage of FIG. 6.

That is, as shown in the lower stage of FIG. 6, in each of the potential distributions, the P+ semiconductor region 501A becomes −0.55 V, the PD 502A becomes 1 V, the transmission transistor 503A becomes 3 V when the transmission transistor 503A is turned on and becomes 0 V when the transmission transistor 503A is turned off, and the ED 504A becomes 3.45 V. In addition, values (voltages) of each potential are not limited to these values as long as the magnitude relationship at each position is satisfied.

Figure 8:
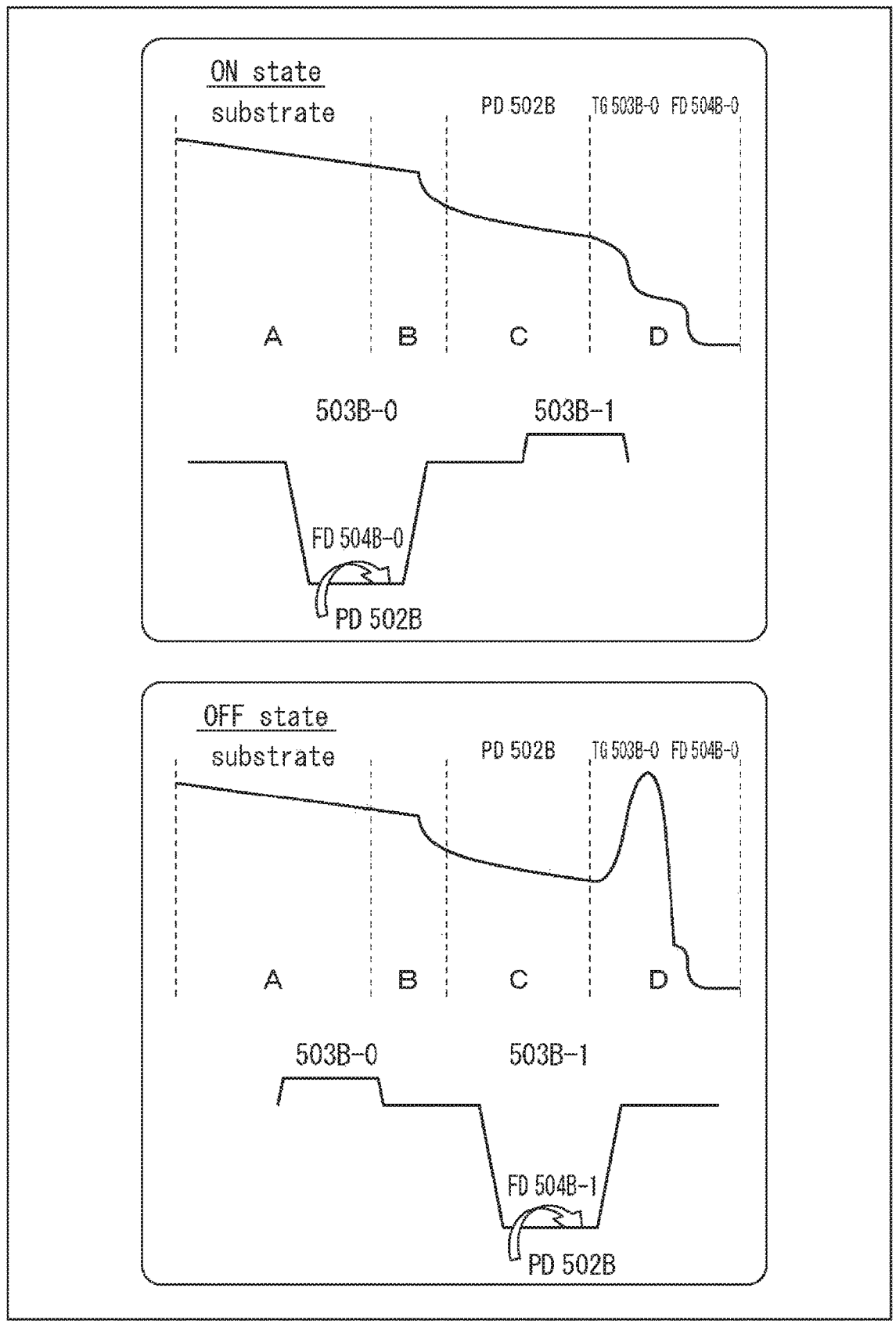
FIG. 8 is a diagram for explaining a potential distribution of the pixel of FIG. 6.

Since such a potential distribution is established, for example, as shown in a lower stage of FIG. 7, in a case in which, in Phase0 (φ0), the transmission transistor 503B-0 is turned on and the transmission transistor 503B-1 is turned off, and in Phase90 (φ1), the transmission transistor 503B-0 is turned off and the transmission transistor 503B-1 is turned on, the potential distribution in each of ranges A to D shown in an upper stage of FIG. 7 becomes a relationship as shown in FIG. 8.

In addition, the range A in the upper stage of FIG. 7 is a region of a lower portion of the read circuit 505 in the substrate 500, the range B is the vicinity of a boundary between the substrate 500 and the PD 502B, the range C is within the PD 502B, and the range D is the vicinity of a boundary between the transmission transistor 503B and the FD 504B. In addition, as shown by X in the upper stage of FIG. 7, a potential barrier is generated between the read circuit 505 and the substrate 500, and the charge is not moved.

That is, in a case in which the transmission transistor 503B is turned on, as shown in an upper portion of an upper stage of FIG. 8, in the range A, an electric field is generated between the two P+ semiconductor regions 501A and 501B, and a current flows from the P+ semiconductor region 501B to the P+ semiconductor region 501A. In this case, a hole in the substrate 500 moves toward the P+ semiconductor region 501A, and an electron moves toward the P+ semiconductor region 501B. As a result, the potential distribution in the substrate 500 has a slope according to the electric field.

In addition, in the range B, as shown in the upper portion of the upper stage of FIG. 8, a step difference according to a potential difference between them described with reference to FIG. 6 is generated at a boundary between the substrate 500 and the PD 502B.

Furthermore, in the range C, the transmission transistor 503B-0 is turned on. Therefore, as shown in the upper portion of the upper stage of FIG. 8, since the potential of the transmission transistor 503B-0 increases at a boundary between the PD 502B and the transmission transistor 503B-0, a slope according to a difference between them is generated.

In addition, in the range D, as shown in the upper portion of the upper stage of FIG. 8, since the potential of FD 504B-0 increases at a boundary between the transmission transistor 503B-0 and the FD 504B-0, a slope according to a difference between them is generated.

As a result, as shown in a lower portion of the upper stage of FIG. 8, in the substrate 500, the charge generated by photoelectric effect is sequentially transmitted from the range A to the range D and is accumulated in the FD 504B-0 through the PD 502B.

On the other hand, in a case in which the transmission transistor 503B-0 is turned off, as shown in the upper portion of the lower stage of FIG. 8, in the range C, since the potential of the transmission transistor 503B-0 is reduced at a boundary between the PD 502B and the transmission transistor 503B-0, a mountain of the potential is generated. In addition, since all of the ranges A, B, and D are similar to those of the case in the upper portion of the upper stage of FIG. 8, the description thereof will be omitted.

As a result, in a case in which the transmission transistor 503B-0 is turned off, in the substrate 500, while the charge generated by the photoelectric effect is sequentially transmitted from the range A to the range C, the charge is not transmitted to the FD 5049-0, and thus the charge is not accumulated in the FD 504B-0.

On the other hand, here, since the transmission transistors 503B-1 is turned on by turning off the transmission transistor 503B-0, and the potential of the FD 504B-1 increases at a boundary between the transmission transistors 503B-1 and the ED 504B-1, a step difference according to a difference between them is generated.

As a result, as shown in a lower portion of the lower stage of FIG. 8, in the substrate 500, the charge generated by the photoelectric effect is accumulated in the FD 504B-1 through the PD 502B and the transmission transistor 503B-1.

Equivalent Circuit Configuration of Pixel of FIG. 6

Next, the equivalent circuit configuration of the pixel 51 of FIG. 6 will be described with reference to a circuit diagram of FIG. 9.

The pixels 51 is configured between the voltage supply lines 30 of the P+ semiconductor regions 501A and 501B, which supplies a predetermined voltage MIX0 (first voltage) and a predetermined voltage MIX1 (second voltage).

The FDs 5044-0 to 504A-3 are connected to respective cathodes through the transmission transistors 503A-0 to 503A-3, and overflow gates 535A are further connected to the respective cathodes, so as to share the PD 502A.

Similarly, the FDs 504B-0 to 504B-3 are connected to respective cathodes through the transmission transistors 503B-0 to 503B-3, and overflow gates 535B are further connected to the respective cathodes, so as to share the PD 502B.

Dual conversion gain (CG) transistors 531A-0 to 531A-3 and reset transistors 532A-0 to 532A-3 are connected to the FDs 504A-0 to 504A-3, respectively. Additional capacitors 536A-0 to 536A-3 are connected between each of the dual CG transistors 531A-0 to 531A-3 and the corresponding reset transistors 532A-0 to 532A-3.

In a case in which a drive signal supplied to each gate electrode of the dual CG transistors 531A-0 to 531A-3 becomes an active state, the dual CG transistors 531A-0 to 531B-3 becomes a conductive state in response to the drive signal, and thus dual CG transistors 531A-0 to 531A-3 connect the corresponding additional capacitors 536A-0 to 536A-3 to the FDs 504A-0 to 504A-3, respectively.

Similarly, dual CG transistors 531B-0 to 531B-3 and reset transistors 532B-0 to 532B-3 are connected to the FDs 504B-0 to 504B-3, respectively. Additional capacitors 536B-0 to 536B-3 are connected between each of the dual CG transistors 531B-0 to 531B-3 and the corresponding reset transistors 532B-0 to 532B-3.

In a case in which a drive signal supplied to each gate electrode of the dual CG transistors 531B-0 to 531B-3 become an active state, the dual CG transistors 531B-0 to 531B-3 becomes a conductive state in response to the drive signal, and thus dual CG transistors 531B-0 to 531A-B connect the corresponding additional capacitors 536B-0 to 536B-3 to the FDs 504B-0 to 504B-3, respectively.

The FDs 504A-0 to 504A-3 are connected to gates of amplification transistors 533A-0 to 533A-3, respectively.

Source electrodes of the amplification transistors 533A-0 to 533A-3 are connected to vertical transmission lines VSL0, VSL1, VSL4, and VSL5 through selection transistors 534A-0 to 534A-3, respectively, and thus a load MOS of a constant current source circuit and a source follower circuit (not shown) connected to one ends of the vertical transmission lines VSL0, VSL1, VSL4, and VSL5 are configured.

With such a configuration, in a case in which the selection transistors 534A-0 to 534A-3 are turned on, the corresponding amplification transistors 533A-0 to 533A-3 output pixel signals according to the charges accumulated in the corresponding FDs 504A-0 to 504A-3, respectively.

In addition, at this time, in a case in which the dual CG transistors 531A-0 to 531A-3 are conducting, a pixel signal including charges accumulated in the additional capacitors 536A-0 to 536A-3 in addition to the charges accumulated in the FDs 504A-0 to 504A-3 is output.

Similarly, amplification transistors 533B-0 to 533B-3 are connected to the FDs 504B-0 to 504B-3, respectively.

Source electrodes of the amplification transistors 533B-0 to 533B-3 are connected to vertical transmission lines VSL2, VSL3, VSL6, and VSL7 through selection transistors 534B-0 to 534B-3, respectively, and thus a load MOS of a constant current source circuit and a source follower circuit (not shown) connected to one ends of the vertical transmission lines VSL2, VSL3, VSL6, and VSL7 are configured.

With such a configuration, in a case in which the selection transistors 534B-0 to 534B-3 are turned on, the corresponding amplification transistors 533B-0 to 533B-3 output pixel signals according to the charges accumulated in the corresponding FDs 504B-0 to 504B-3, respectively.

In addition, at this time, in a case in which the dual CG transistors 531B-0 to 531B-3 are conducting, a pixel signal including charges accumulated in the additional capacitors 536B-0 to 536B-3 in addition to the charges accumulated in the FDs 504B-0 to 504B-3 is output.

The transmission transistors 503A-0 to 503A-3 and 503B-0 to 503B-3, the dual CG transistors 531A-0 to 531A-3 and 531B-0 to 531B-3, and the reset transistors 532A-0 to 532A-3 and 532B-0 to 532B-3, the amplification transistors 533A-0 to 533A-3 and 533B-0 to 533B-3, and the selection transistors 534A-0 to 534A-3 and 534B-0 to 534B-3 of the pixel 51 are controlled, for example, by the vertical driving unit 22.

With such a configuration, in a case in which the overflow gates 535A and 535B are turned on, after the PDs 502A and 502B are reset, the overflow gates 535A and 535B are turned off. In addition, the FD 504A-0 to 504A-3 and 504B-0 to 504B-3 are reset by turning on the dual CG transistors 531A-0 to 531A-3 and 531B-0 to 531B-3 and the reset transistors 532A-0 to 532A-3 and 532B-0 to 532B-3.

Thereafter, the dual CG transistors 531A-0 to 531A-3 and 531B-0 to 531B-3 and the reset transistors 532A-0 to 532A-3 and 532B-0 to 532B-3 are turned off.

In addition, the voltage applied to the P+ semiconductor regions 501A and 501B is switched by the tap driving unit 21. Therefore, an electric field is generated, and in the substrate 500, the charge generated by the photoelectric conversion according to the light amount of the reflected light by the infrared light is distributed and transmitted to the PDs 502A and 502B.

The transmission transistors 503A-0 to 503A-3 and 503B-0 to 503B-3 is turned on or turned off at each of the timings of the phases Phase0 ($\varphi$0), Phase90 ($\varphi$1), Phase180 ($\varphi$2), and Phase270 ($\varphi$3). With this operation, the charges distributed to the PD 502A and 502B are transmitted to the FDs 504A-0 to 504A-3 and 504B-0 to 504B-3 at the timing when the transmission transistors 503A-0 to 503A-3 and 503B-0 to 503B-3 are turned on.

The amplification transistors 533A-0 to 533A-3 and 533B-0 to 533B-3 output voltages according to the charges accumulated in the FDs 504A-0 to 504A-3 and 504B-0 to 504B-3 as the pixel signal, respectively.

In addition, in a case in which a selection signal supplied to gate electrodes becomes an active state, the selection transistors 534A-0 to 534A-3 and 534B-0 to 534B-3 become a conductive state in response to the selection signal and output the pixel signals output from the amplification transistors 533A-0 to 533A-3 and 533B-0 to 533B-3 to the vertical transmission lines VSL0, VSL1, VSL4, VSL5, VSL2, VSL3, VSL6, and VSL7, respectively.

Operation of Pixel 51 of FIG. 6

Figure 10:
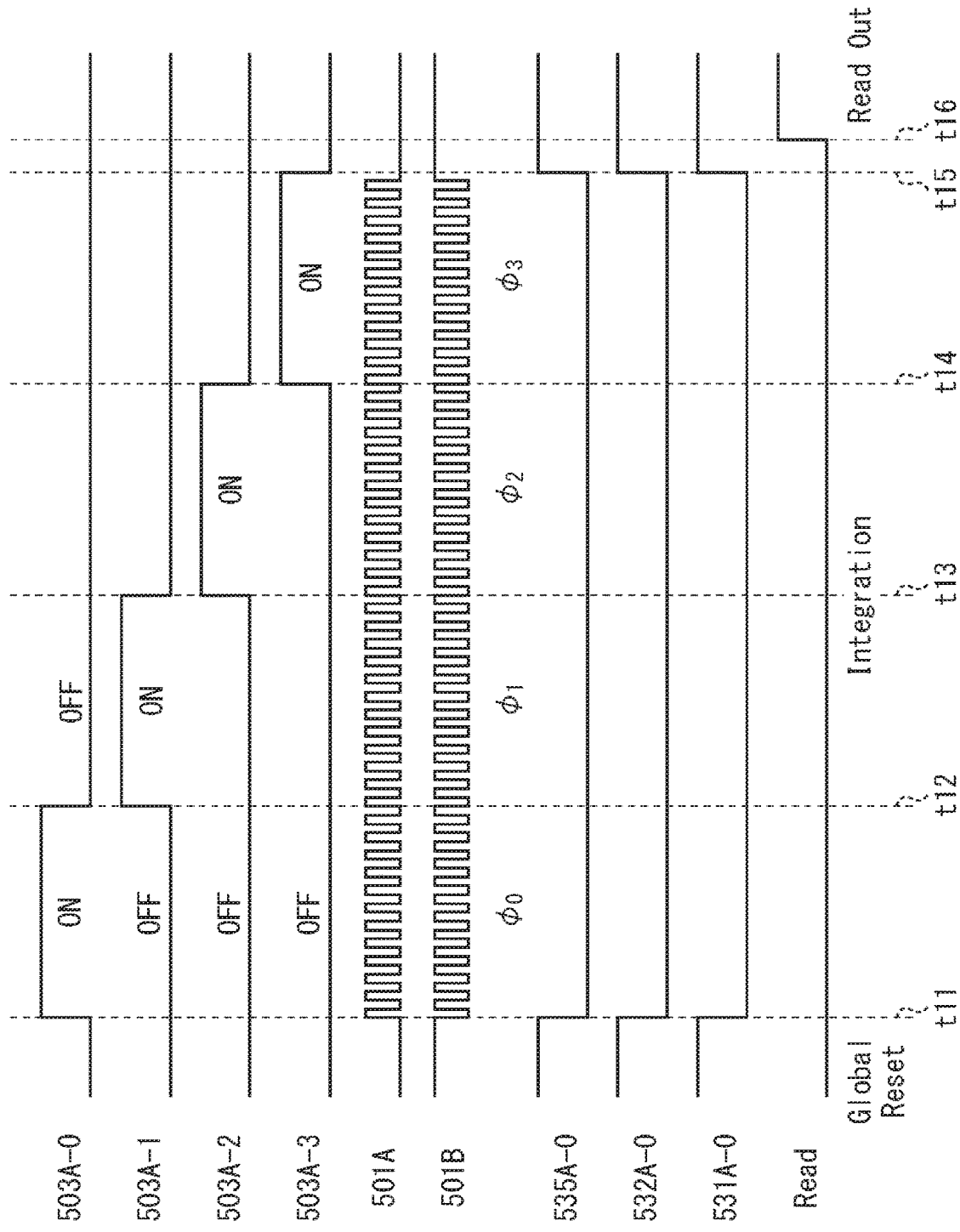
FIG. 10 is a timing chart for explaining the operation of the pixel of FIG. 6.

Next, the operation of the pixel 51 of FIG. 6 will be described with reference to a timing chart of FIG. 10.

At a timing up to a time t0, the overflow gates 535A and 535B, the dual CG transistors 531A-0 to 531A-3 and 531B-0 to 531B-3, and the reset transistors 532A-0 to 532A-3 and 532B-0 to 532B-3 are turned on, and the PDs 502A and 502B and the FDs 504A-0 to 504A-3 and 504B-0 to 504B-3 are reset (GlobalReset).

After the reset, at a time t11, the overflow gates 535A and 535B, the dual CG transistors 531A-0 to 531A-3 and 531B-0 to 531B-3, and the reset transistors 532A-0 to 532A-3 and 532B-0 to 532B-3 are turned off. In addition, in a case in which the additional capacitors 536A-0 to 536A-3 and 536B-0 to 536B-3 are used, the dual CG transistors 531A-0 to 531A-3 and 531B-0 to 531B-3 are kept ON.

In addition, the voltages of 1.5 V or 0 V is alternately applied to the P+ semiconductor regions 501A and 501B at a predetermined frequency, and the P+ semiconductor regions 501A and 502A alternately function as the active tap and the inactive tap. In addition, in the following description, a case in which the P+ semiconductor region 501A is set as the active tap will be described.

At a time t11 to t12, as the timing of the phase Phase0 ($\varphi$0), the transmission transistor 503A-0 is turned on, the transmission transistors 503A-1 to 503A-3 are turned off, and thus the charges accumulated in the PD 502A are transmitted to the FD 504A-0 and accumulated in the FD 504A-0.

At a time t12 to t13, as the timing of the phase Phase90 ($\varphi$1), the transmission transistor 503A-1 is turned on, the transmission transistors 503A-0, 503A-2, and 503A-3 are turned off, and thus the charges accumulated in the PD 502A are transmitted to the FD 504A-1 and accumulated in the FD 504A-1.

At a time t13 to t14, as the timing of the phase Phase180 ($\varphi$2), the transmission transistor 503A-2 is turned on, the transmission transistors 503A-0, 503A-1, and 503A-3 are turned off, and thus the charges accumulated in the PD 502A are transmitted to the FD 504A-2 and accumulated in the FD 504A-2.

At a time t14 to t15, as the timing of the phase Phase270 ($\varphi$3), the transmission transistor 503A-3 is turned on, the transmission transistors 503A-0 to 503A-2 are turned off, and thus the charges accumulated in the PD 502A are transmitted to the FD 504A-3 and accumulated in the FD 504A-3.

At a time t16, the read circuit 505 reads the charges accumulated in each of the FDs 504A-0 to 504A-3. Along with this, the signal processing unit 31 obtains the signal values $q_{0A}$, $q_{1A}$, $q_{2A}$, and $q_{3A}$ of each of the phases Phase0, Phase90, Phase180, and Phase270, obtains the phase shift amount θ corresponding to the delay time ΔT by the distribution ratio of the signal values $q_{0A}$, $q_{1A}$, $q_{2A}$, and $q_{3A}$ calculates the distance to the object on the basis of the delay time ΔT corresponding to the phase shift amount θ, and outputs the distance to the object.

Since it is possible to consolidate the time for calculating the signal values of all the phases at once by the above series of processes, it is possible to shorten the time related to the calculation process of the phase shift amount θ, and it is possible to calculate the distance to the object more quickly.

As a result, even in a case in which the movement of the object is fast, it is possible to improve the accuracy of the distance to be measured in real time.

In addition, in the above description, an example in which the period 2T of the irradiation light of which brightness changes at a predetermined period is divided into four and one period 2T is set to the four phases has been described. However, the number of divisions of the period 2T may be any number as long as the number of divisions is 2 or more. However, the numbers of the transmission transistors 503A and 503B and the FDs 504A and 504B connected to the PDs 502A and 502B may be required to be the same.

In addition, in the above description, an example, in which, among the transmission transistors 503A-0 to 503A-3, in the phase Phase0, the transmission transistor 503A-0 is turned on and the other transmission transistors are turned off, in the phase Phase90, the transmission transistor 503A-1 is turned on and the other transmission transistors are turned off, in the phase Phase180, the transmission transistor 503A-0 is turned on and the other transmission transistors are turned off, and in the phase Phase270, the transmission transistor 503A-1 is turned on and the other transmission transistors are turned off, has been described.

However, with respect to the phase for turning on one of the transmission transistors 503A-0 to 503A-3 and the phase for turning off the other transmission transistors, and a phase other than the phases described above, phases other than those above may be allocated to turning on or off the transmission transistors 503A-0 to 503A-3.

In addition, in the above description, an example, in which with respect to each of the phases Phase0, Phase90, Phase180, and Phase270, the signal values $q_{0A}$, $q_{1A}$, $q_{2A}$, and $q_{3A}$ are calculated to perform the distance measurement by one accumulation result, has been described. However, the charge accumulation may be repeated a plurality of times to perform the calculation and the distance measurement.

2. Modified Example of First Embodiment

In the above description, the PD 502A and the transmission transistors 503A-0 to 503A-3 are directly connected with each other, and the PD 502B and the transmission transistors 503B-0 to 503B-3 are directly connected with each other. However, collecting gates may be provided between the PD 502A and the transmission transistors 503A-0 to 503A-3 and between the PD 502B and the transmission transistors 503B-0 to 503B-3.

Figure 11:
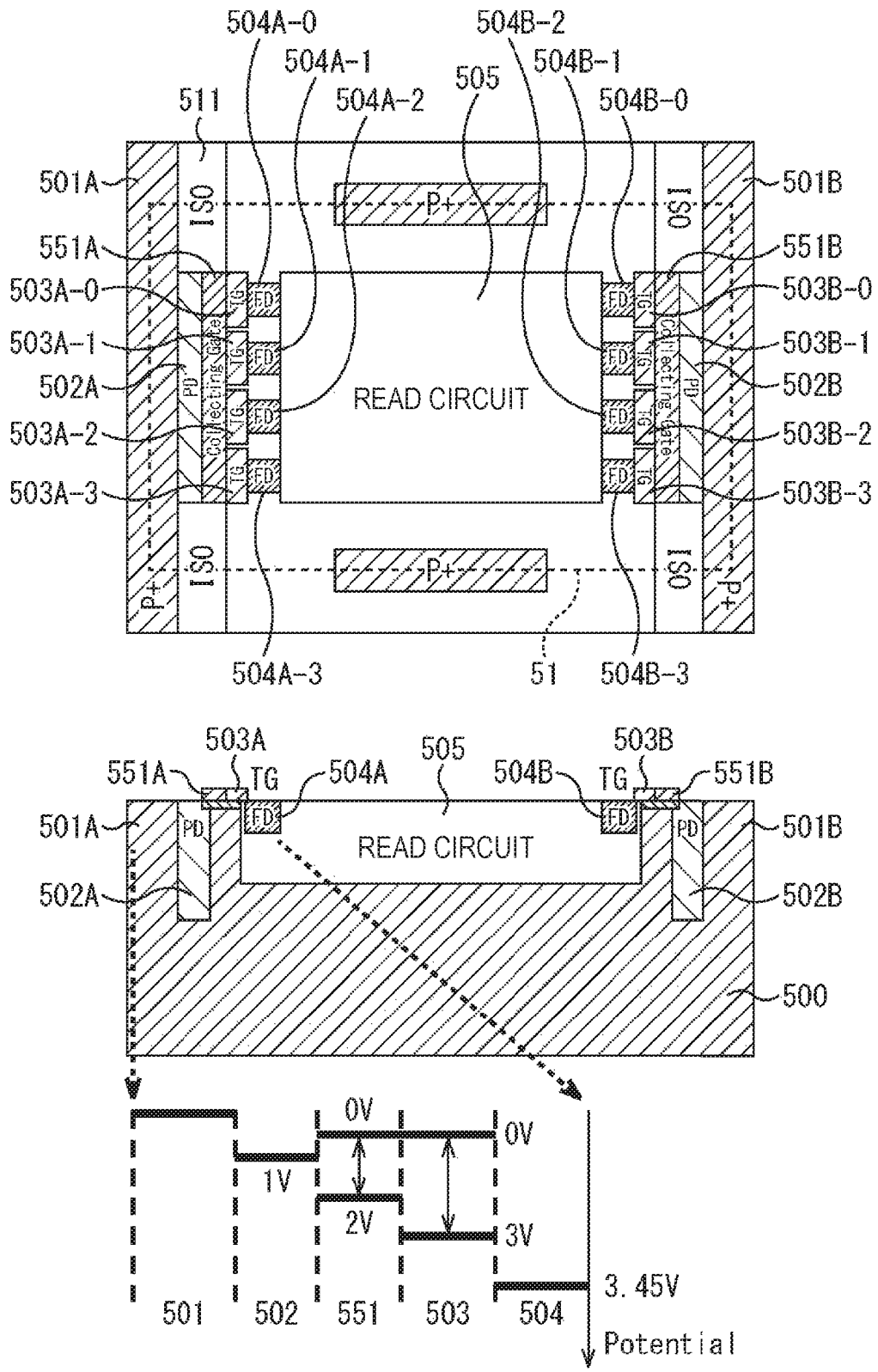
FIG. 11 is a diagram for explaining a modified example of the first embodiment of the pixel configuring the light receiving element of the present disclosure.

FIG. 11 illustrates a configuration example of a pixel 51 in which a collecting gate 551A is provided between the PD 502A and the transmission transistors 503A-0 to 503A-3 and a collecting gate 551B is provided between the PD 502B and the transmission transistors 503B-0 to 503B-3.

In the pixel 51 of FIG. 11, in a case in which the PD 502B on a right side in the figure functions as the active tap and the PD 502A functions as the inactive tap by applying the voltage of 1.5 V to the P+ semiconductor region 501B and the voltage of, for example, 0 V to the P+ semiconductor region 501A, as shown in a middle stage of FIG. 11, the potential distribution in each of the P+ semiconductor region 501A, the PD 502A, the transmission transistor 503A, and the FD 504A on a left side in the figure becomes, for example, a relationship shown in a lower stage of FIG. 11.

That is, as shown in the lower stage of FIG. 11, in each of the potential distributions, the P+ semiconductor region 501A becomes −0.55 V, the PD 502A becomes 1 V, the transmission transistor 503A becomes 3 V When the transmission transistor 503A is turned on and becomes 0 V when the transmission transistor 503A is turned off, the collecting gate 551 becomes 2 V when the collecting gate 551 is turned on and becomes 0 V when the collecting gate 551 is turned off, and the FD 504A becomes 3.45 V. In addition, values (voltages) of each potential are not limited to these values as long as the magnitude relationship at each position is satisfied.

That is, the PD 502A and the transmission transistors 503A-0 to 503A-3 are connected through the collecting gate 551A, and the PD 502B and the transmission transistors 503B-0 to 503B-3 are connected through the collecting gate 551B.

Equivalent Circuit Configuration of Pixel of FIG. 11

Next, the equivalent circuit configuration of the pixel 51 of FIG. 11 will be described with reference to a circuit diagram of FIG. 12. In addition, in the circuit diagram of FIG. 12, the same components as those described with reference to FIG. 9 are denoted by the same reference numerals, and the description thereof will be omitted as appropriate.

Figure 9:
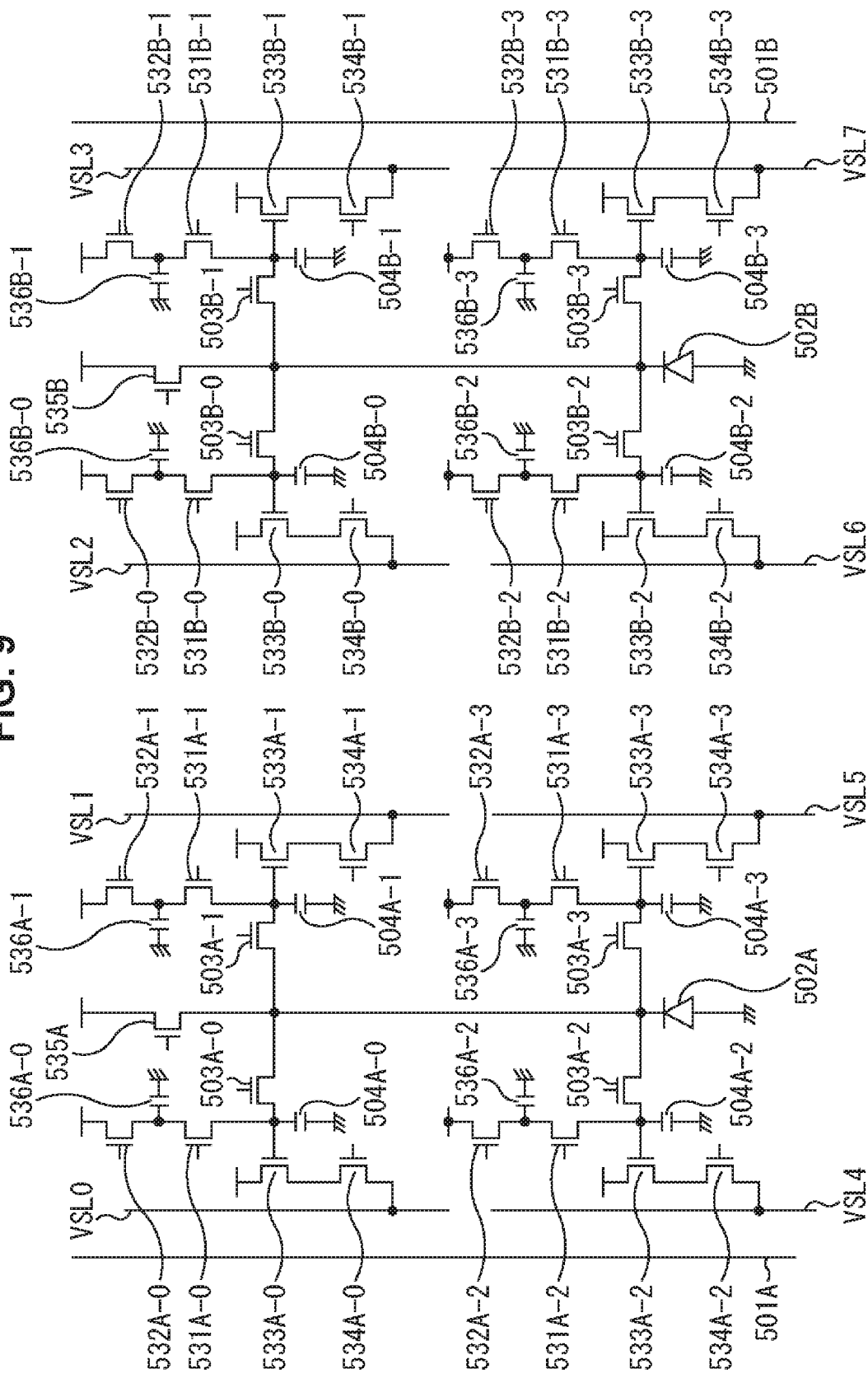
FIG. 9 is a diagram for explaining an equivalent circuit configuration of the pixel of FIG. 6.
Figure 12:
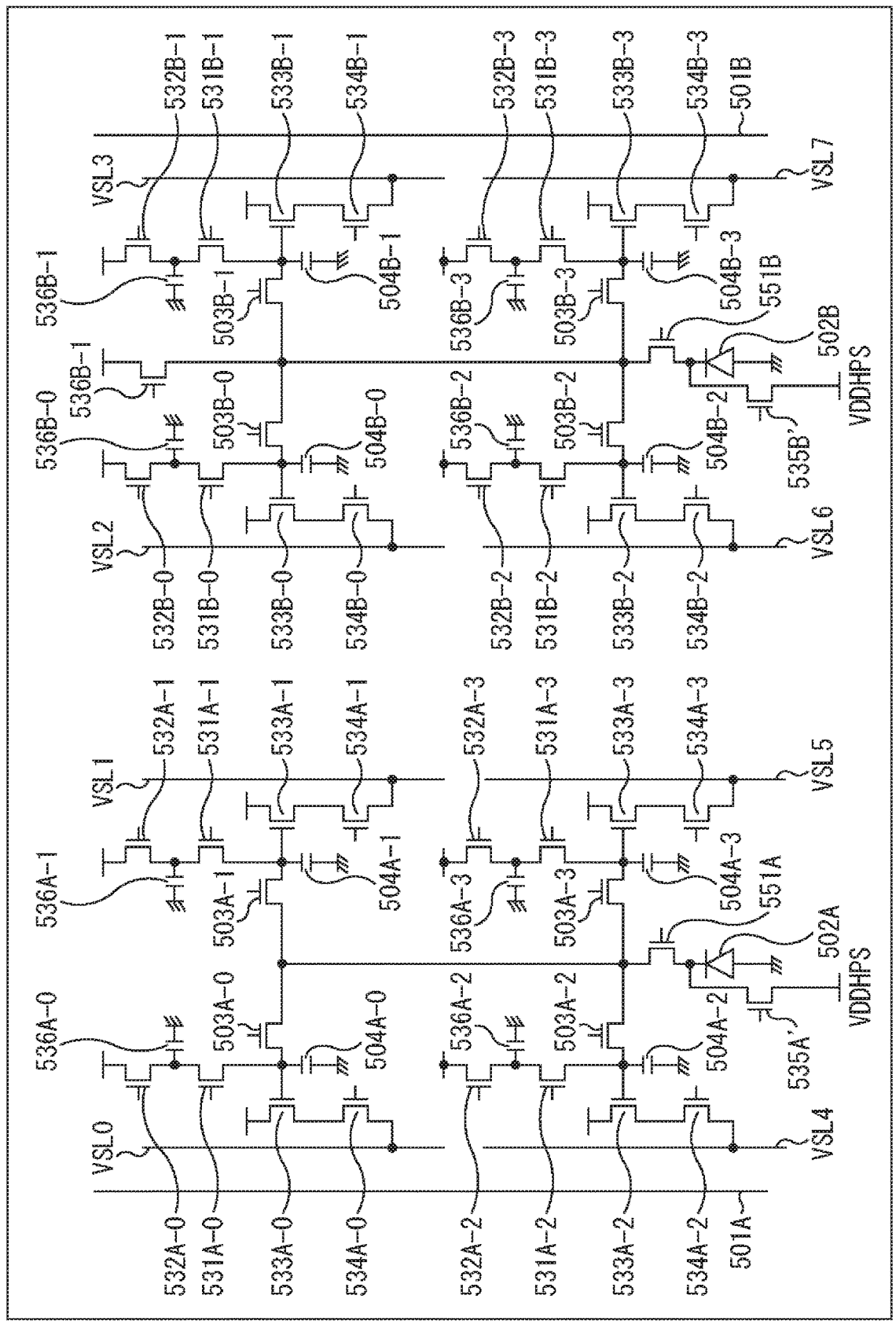
FIG. 12 is a diagram for explaining an equivalent circuit configuration of the pixel of FIG. 11.

That is, in the circuit diagram of FIG. 12, the difference from the circuit diagram of FIG. 9 is that new collecting gates 551A and 551B, the overflow gate 535A', 535B' are provided and that the overflow gate 535A is removed.

As shown in the equivalent circuit diagram of FIG. 12, the collecting gate 551A is connected between the PD 502A and the transmission transistors 503A-0 to 503A-3, and the collecting gate 551B is connected between the PD 502B and the transmission transistors 503B-0 to 503B-3.

When one of the transmission transistors 503A-0 to 503A-3 is switched from a predetermined state to an ON state and the others are switched to an OFF state, the collecting gate 551A is controlled to be turned off at a timing immediately before the switching is performed, and after the switching is completed, the collecting gate 551A is controlled to be turned on.

That is, with this operation of the collecting gate 551A, when one of the transmission transistors 503A-0 to 503A-3 is turned on and the others are turned off the collecting gate 551A prevents a problem that any one or a plurality of transmission transistors 503A are simultaneously turned on and the charge from the PD 502A is distributed and transmitted to a plurality of FDs 504A among the FDs 504A-0 to 504A-3.

Similarly, when one of the transmission transistors 503B-0 to 503B-3 is turned on and the others are turned off, the collecting gate 551B is controlled to be turned off at a timing immediately before the switching is performed, and after the switching is completed, the collecting gate 551B is controlled to be turned on.

That is, with this operation of the collecting gate 551B, it is prevented that when one of the transmission transistors 503B-0 to 503B-3 is turned on and the others are turned off, any one or a plurality of transmission transistors 503B are simultaneously turned on and the charge from the PD 502B is distributed and transmitted to a plurality of FDs 504B among the FDs 504B-0 to 504B-3.

Therefore, the collecting gates 551A and 551B are able to be controlled so that the charges from the PDs 502A and 502B are not distributed and transmitted to the plurality of FDs 504A and 504B among the FDs 504A-0 to 504A-3 or 504B-0 to 504B-3.

As a result, it is possible to obtain the signal values $q_{0,A}$, $q_{1,A}$, $q_{2,A}$, and $q_{3,A}$ of each of the phases Phase0 to Phase3 with high precision, and it is possible to realize high-accuracy distance measurement at a high speed.

3. Second Embodiment

In the configuration of the pixel 51 described above, an example in which the read circuit 505 is sandwiched between the P+ semiconductor regions 501A and 501B, and the PDs 502A and 502B are opposed to each other and laid symmetrically has been described. However, the configuration of the pixel 51 may have other layouts.

Figure 13:
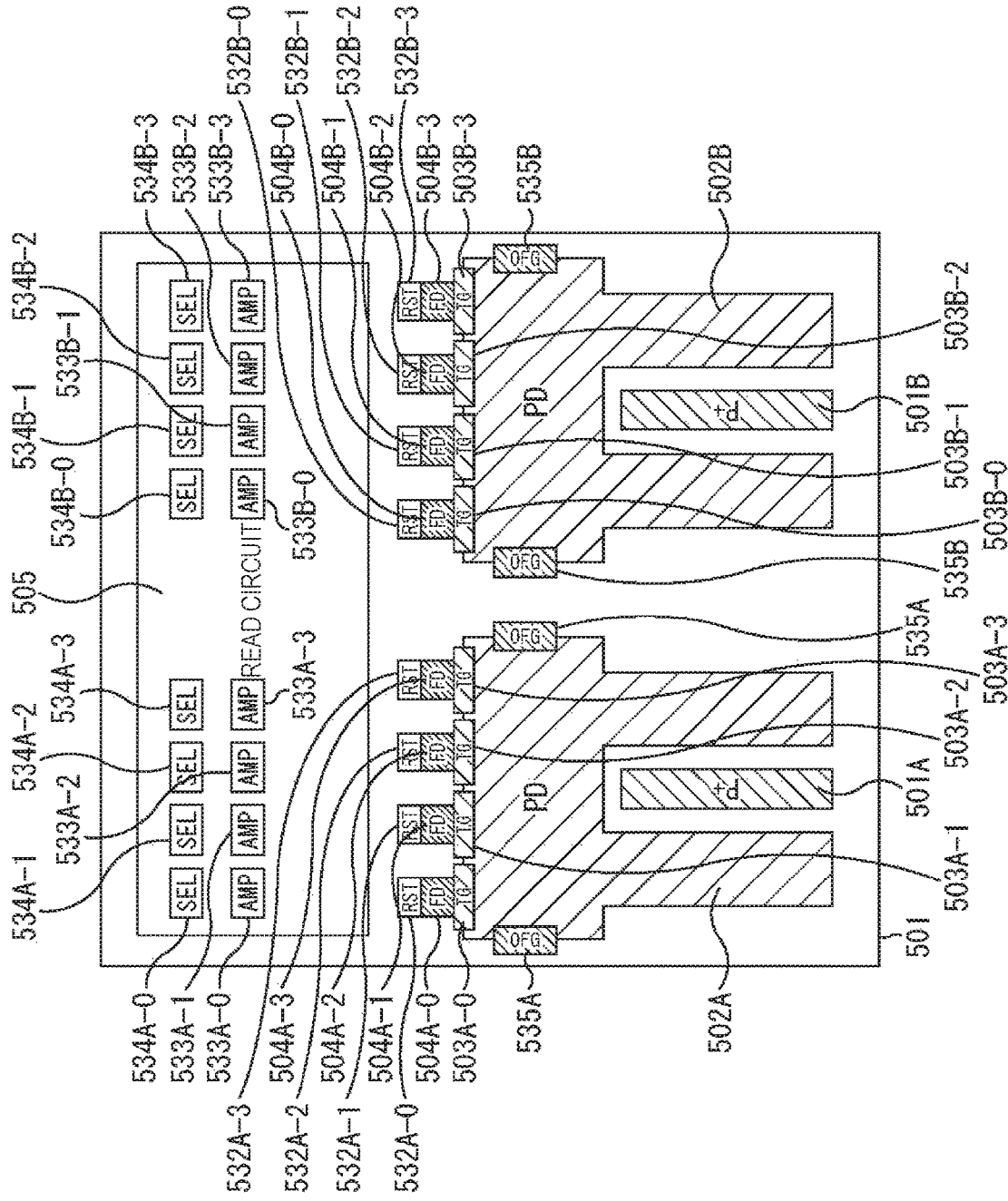
FIG. 13 is a diagram for explaining a layout configuration example of a second embodiment of a pixel configuring the light receiving element of the present disclosure.

FIG. 13 illustrates a configuration example of another layout in which the pixel 51 is viewed from an upper surface direction. In addition, in the configuration of the pixel 51 of FIG. 13, the same components having the same functions as those of FIG. 6 are denoted by the same reference numerals, and the description thereof will be omitted as appropriate.

That is, the pixel 51 of FIG. 13 is different from the pixel 51 of FIG. 6 in that the read circuit 505 is laid out in an upper side of the figure and the PDs 502A and 502B are laid out side by side in a lower side of the figure. In other words, in the pixel 51 of FIG. 13, a disposition direction in which the reset transistor (RST) 532A-0 to 532A-3, the FDs 504A-0 to 504A-3, the transmission transistors (TG) 503A-0 to 503A-3, the PD 502A, and the P+ semiconductor region 501A are sequentially disposed (vertical direction in figure) is substantially parallel to a disposition direction in which the reset transistor (RST) 532B-0 to 532B-3, the FDs 504B-0 to 504B-3, the transmission transistors (TG) 503B-0 to 503B-3, the PD 502B, and the P+ semiconductor region 501B are sequentially disposed, and the layout is symmetrical with respect to a horizontal direction in the pixel 51.

In the read circuit 505, the selection transistors (SEL) 534A-0 to 534A-3 are disposed in order from a left in an upper stage of a left portion in the figure, and the amplification transistors 533A-0 to 533A-3 are disposed under the selection transistors (SEL) 534A-0 to 534A-3, respectively.

In addition, in the read circuit 505, the selection transistors (SEL) 534B-0 to 534B-3 are disposed in order from the left in an upper stage of a right portion in the figure, and the amplification transistors 533B-0 to 533B-3 are disposed under the selection transistors (SEL) 534B-0 to 534B-3, respectively.

Therefore, in the read circuit 505, the selection transistors (SEL) 534A-0 to 534A-3 and the amplification transistors 533A-0 to 533A-3, and the selection transistors (SEL) 534B-0 to 534B-3 and the amplification transistors 533B-0 to 533B-3 are symmetrically laid out in the horizontal direction.

In addition, each of the PDs 502A and 502B has a π shape, and the P+ semiconductor regions 501A and 501B are formed so as to be sandwiched between a concave portion of the PDs 502 A and 502B having the π shape.

In addition, the FDs 504A-0 to 504A-3 are sequentially connected to an upper portion of the PD 502A in the figure from a left through the transmission transistors 503A-0 to 503A-3, respectively.

Furthermore, the FDs 504B-0 to 504B-3 are sequentially connected to an upper portion of the PD 502A in the figure from a left through the transmission transistors 503B-0 to 503B-3, respectively.

In addition, the overflow gates 535A and 535B are connected to the left and right of the PDs 502A and 502B in the figure, respectively.

In addition, although not shown, the FD 504A-0 to 504A-3 and the FDs 504B-0 to 504B-3 are electrically connected to the read circuit 505. In addition, since the equivalent circuit configurations of the pixel 51 of FIG. 6 and the pixel 51 of FIG. 13 are the same, the description thereof will be omitted.

With the above configuration, also in the pixel 51 of FIG. 13, it is possible to perform the distance measurement with high accuracy and at a high speed, even for the object that moves fast.

First Application Example of Second Embodiment

Figure 14:
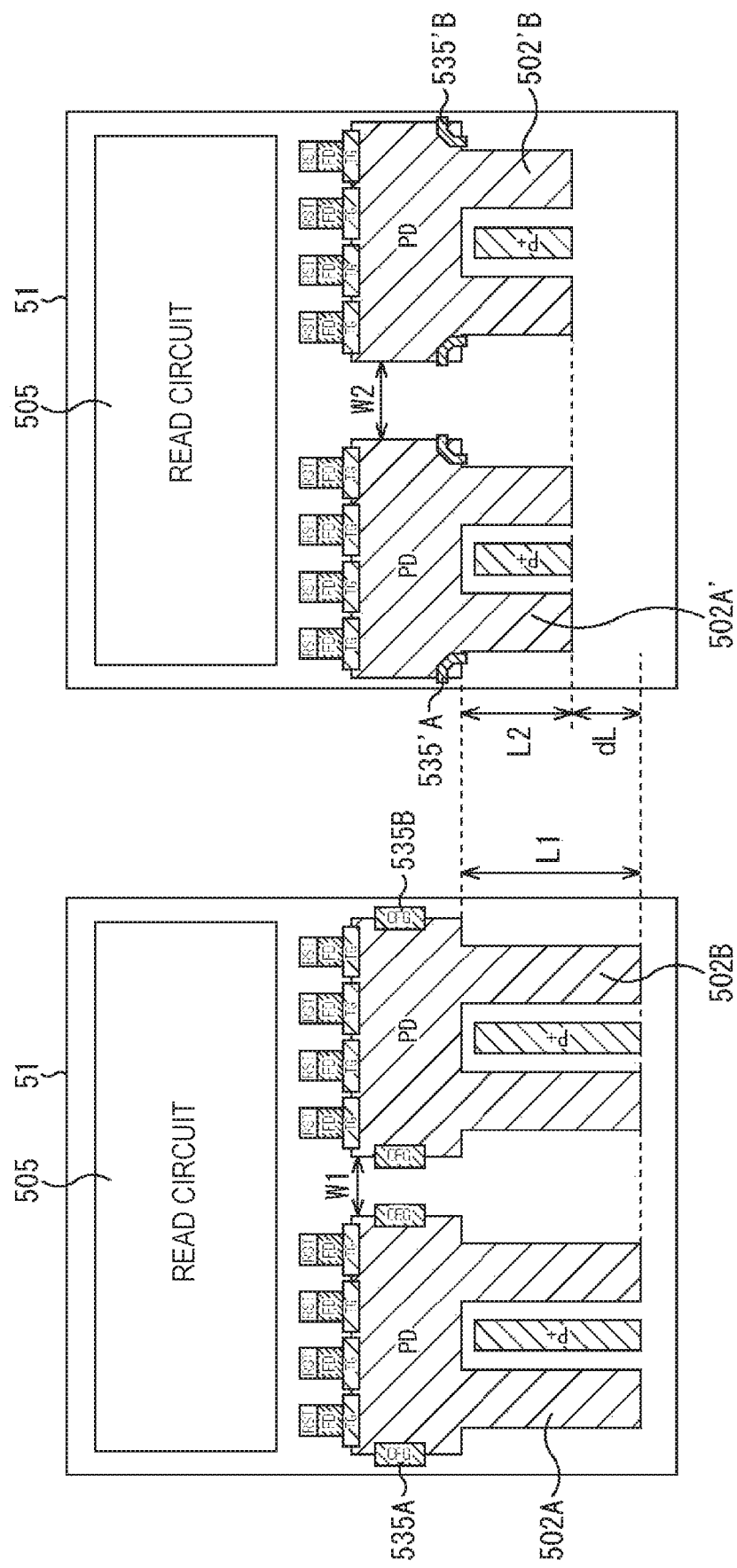
FIG. 14 is a diagram for explaining a layout configuration example of a first application example in a second embodiment of a pixel configuring the light receiving element of the present disclosure.

The layout and shape of the PDs 502A and 502B may be other than the layout and shape shown in FIG. 13, and for example, as shown by PDs 502A' and 502B' in the pixel 51 on a right portion of FIG. 14, a length of two end portions of the π shape may be shortened.

In addition, a configuration in which the pixel 51 of a left portion of FIG. 14 corresponds to the pixel 51 of FIG. 13 is shown for comparison with the pixel 51 of the right portion of FIG. 14. In addition, in FIG. 14, description of the selection transistor 534 and the amplification transistor 533 in the read circuit 505 is omitted.

That is, in the right portion of FIG. 14, while the length of the two end portions of π shape of the PDs 502A and 502B is a length L1, a length of the PDs 502A' and 502B' is a length of L2 (<L1) and is shortened by a length dL.

In addition, a distance between the PDs 502A and 502B may be made wider. That is, in the pixel 51 of the left portion of FIG. 14, the distance between the PD 502A and the PD 502B is a distance W1, however, in the pixel 51 of the right portion of FIG. 14, a distance between the PD 502A' and the PD 502B' is a distance W2 (>W1).

Furthermore, in the right portion of FIG. 14, OFGs 535A' and 535B' are provided instead of OFGs 535A and 535B in the left portion of FIG. 14. Although functions of the OFGs 535A' and 535B' are similar to the functions of the OFGs 535A and 535B, while the PDs 502A and 502B are formed on a side surface of the π shape, the PDs 502A and 502B are formed to surround a corner portion in the vicinity of a base of the two end portions.

In both cases, it is possible to perform distance measurement with high accuracy and high speed even with a fast moving object.

Second Application Example of Second Embodiment

In the pixel 51 of FIG. 13, the PDs 502A and 502B are laid out with a predetermined distance in the horizontal direction in the figure, but the PDs 502A and 502B may be surrounded by an N-semiconductor region so that each of the PDs 502A and 502B is surrounded.

Figure 15:
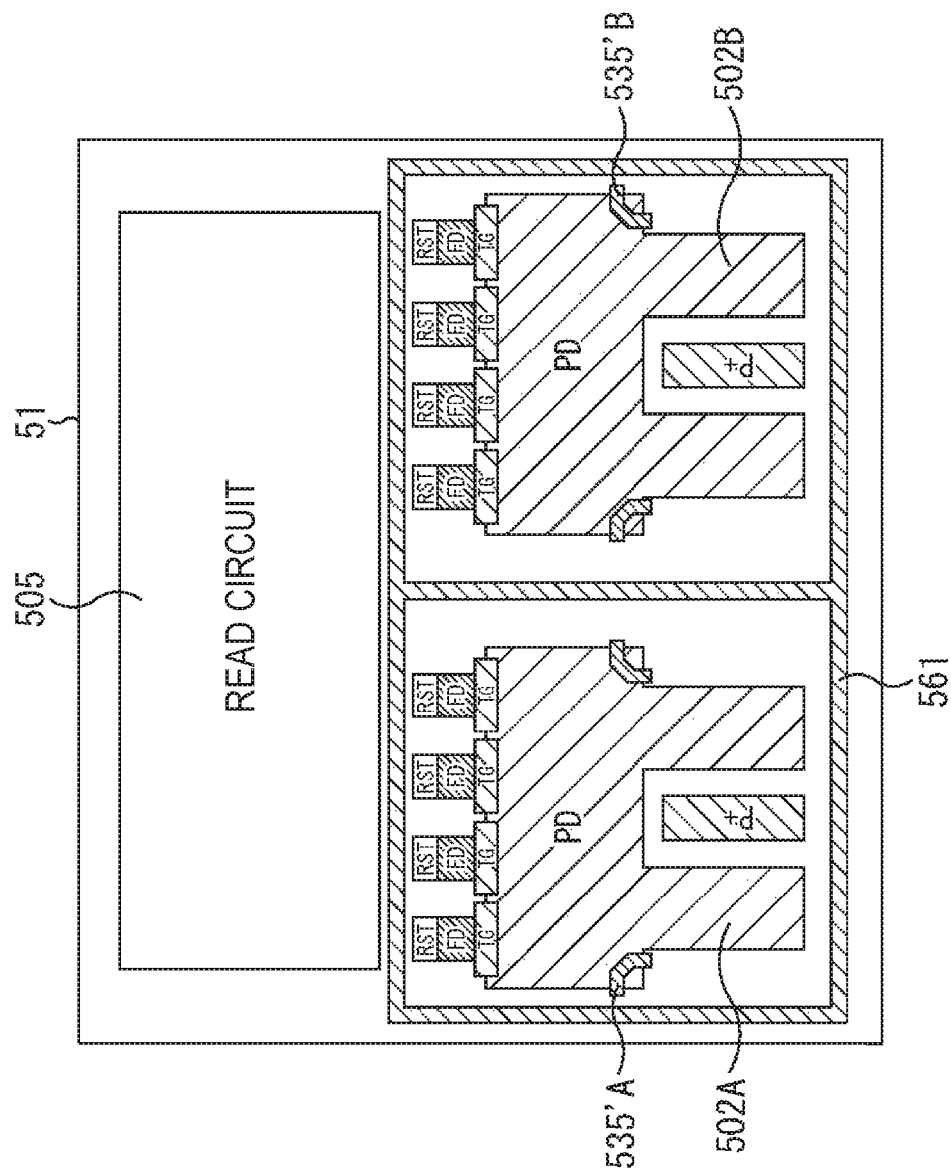
FIG. 15 is a diagram for explaining a layout configuration example of a second application example in a second embodiment of a pixel configuring the light receiving element of the present disclosure.

FIG. 15 shows a configuration example of the pixel 51 in which the N-semiconductor region 561 is formed to surround each of the PDs 502A and 502B.

With such a configuration, it is possible to perform distance measurement with high accuracy and high speed even with a fast moving object.

Third Application Example of Second Embodiment

Figure 16:
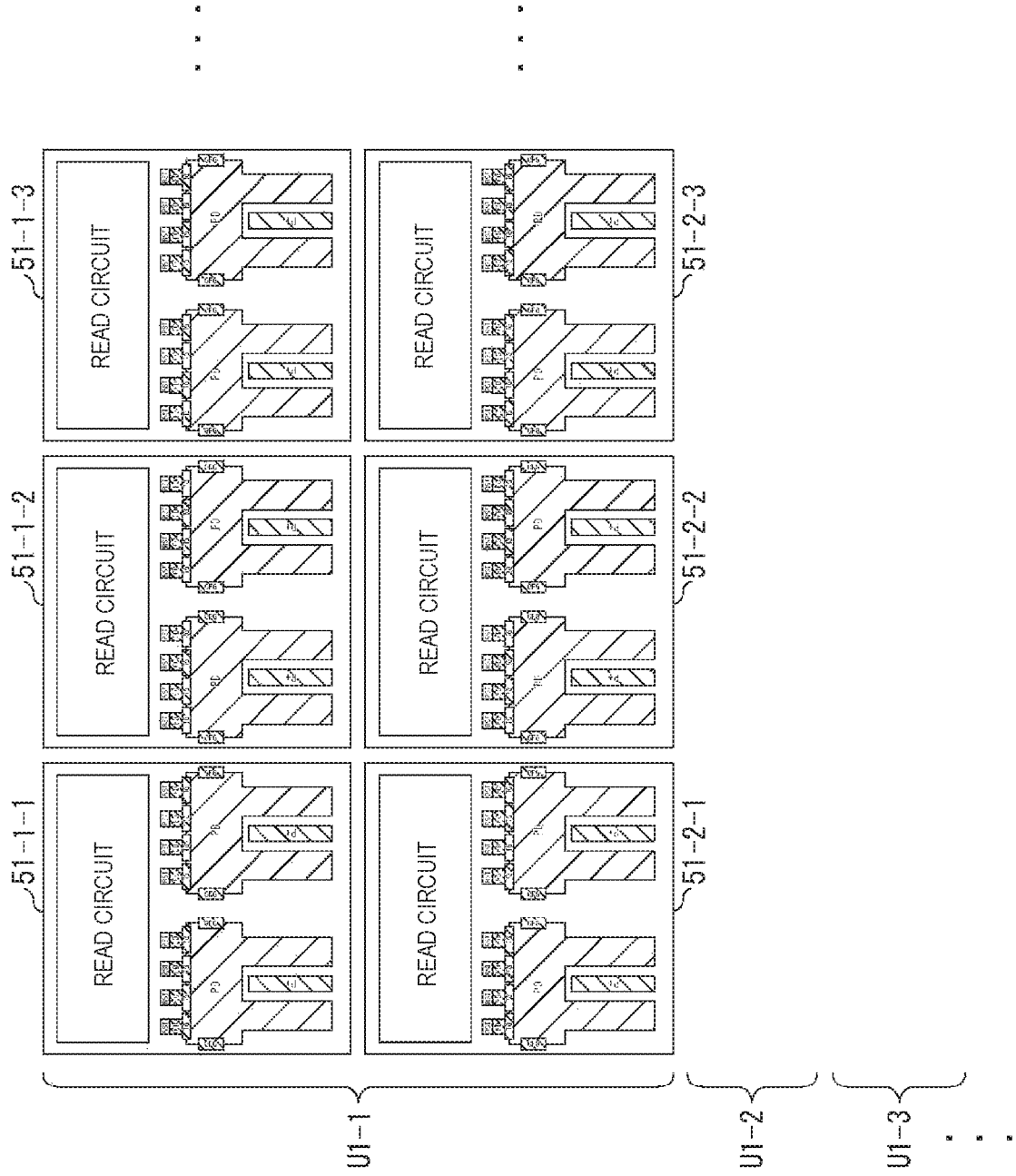
FIG. 16 is a diagram for explaining a pixel disposition example of a third application example in a second embodiment of a pixel configuring the light receiving element of the present disclosure.

For example, the disposition of the pixels 51 of FIG. 13 may be disposed in the direction same as the horizontal direction and the vertical direction as shown in FIG. 16.

That is, FIG. 16 shows an example in which a unit U1 including rows in which pixels 51-1-1, 51-1-2, 51-1-3, . . . are disposed in the direction same as the horizontal direction and rows in which pixels 51-2-1, 51-2-2, 51-2-3, . . . are disposed in also the same direction under the rows in which the pixels 51-1-1, 51-1-2, 51-1-3, . . . are disposed is repeatedly disposed as U1-1, U1-2, U1-3, . . . in the vertical direction.

Fourth Application Example of Second Embodiment

In addition, for example, as shown in FIG. 7, in the disposition of the pixels 51 of FIG. 13, the two row units disposed so that the two end portions of the π shape are opposed to each other may be repeatedly disposed in the vertical direction.

Figure 17:
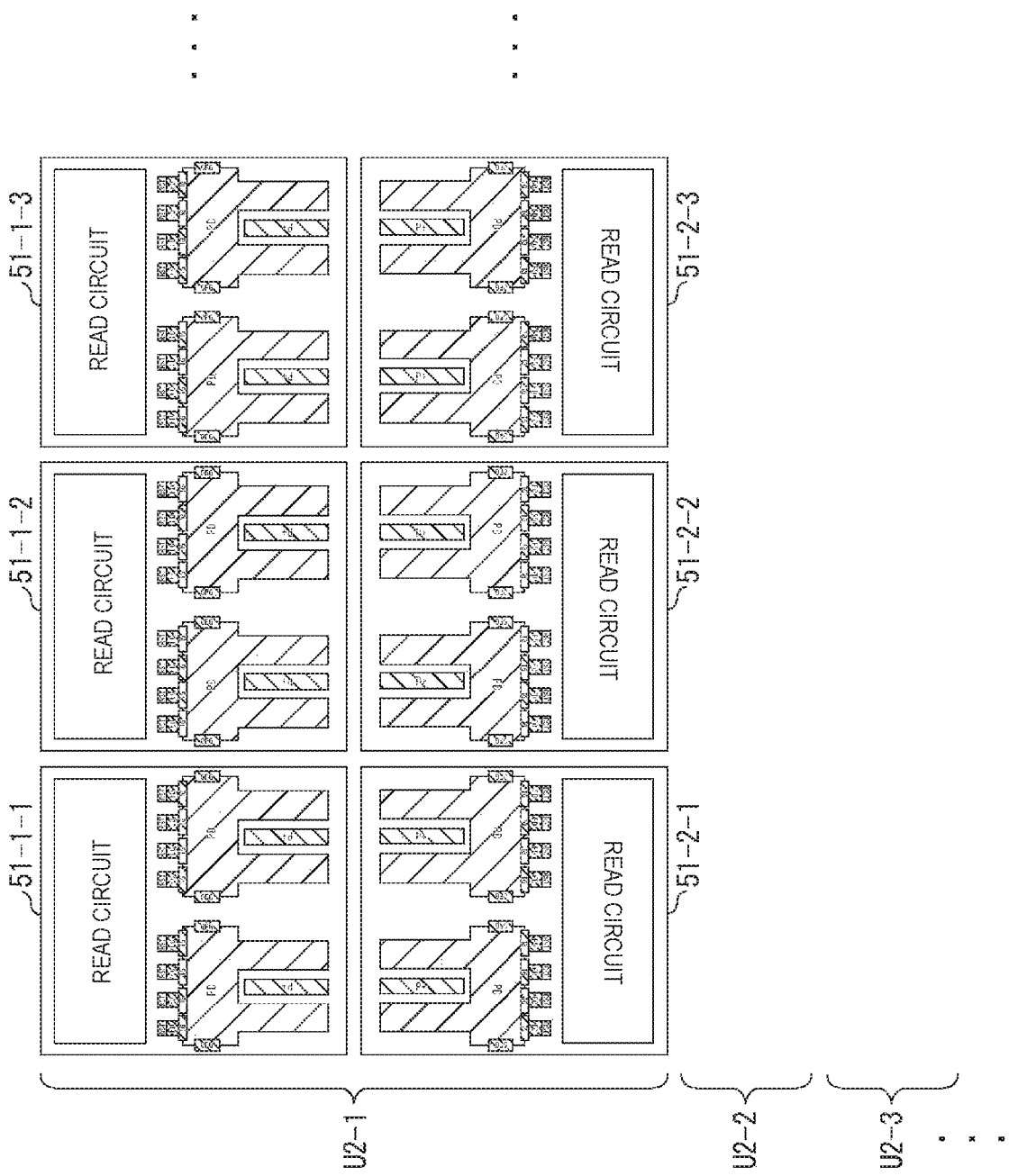
FIG. 17 is a diagram for explaining a pixel disposition example of a fourth application example in the second embodiment of a pixel configuring the light receiving element of the present disclosure.

That is, FIG. 17 shows an example in which a unit U2 including the rows of the pixels 51-1-1, 51-1-2, 51-1-3, . . . disposed so that the two end portions of the π shape are opposed to each other and the rows in which the pixels 51-2-1, 51-2-2, 51-2-3, . . . are disposed is repeatedly disposed as U2-1, U2-2, U2-3, in the vertical direction.

In addition, FIGS. 16 and 17 show an example in which the pixels 51 of FIG. 13 are disposed, but instead of the pixels 51 of FIG. 13, the pixels 51 of FIGS. 14 and 15 may be disposed.

4. Third Embodiment

In the above-described configuration of the pixel 51, an example in which the PDs 502A and 502B of the π shape are disposed at a lower portion and the read circuit 505 is disposed at an upper portion has been described, but a unit configuration of a pair in which the PD 502 of a U shape and the read circuit 505 are arranged in a predetermined direction may be laid out so that the unit configurations are repeatedly arranged in the predetermined direction.

Figure 19:
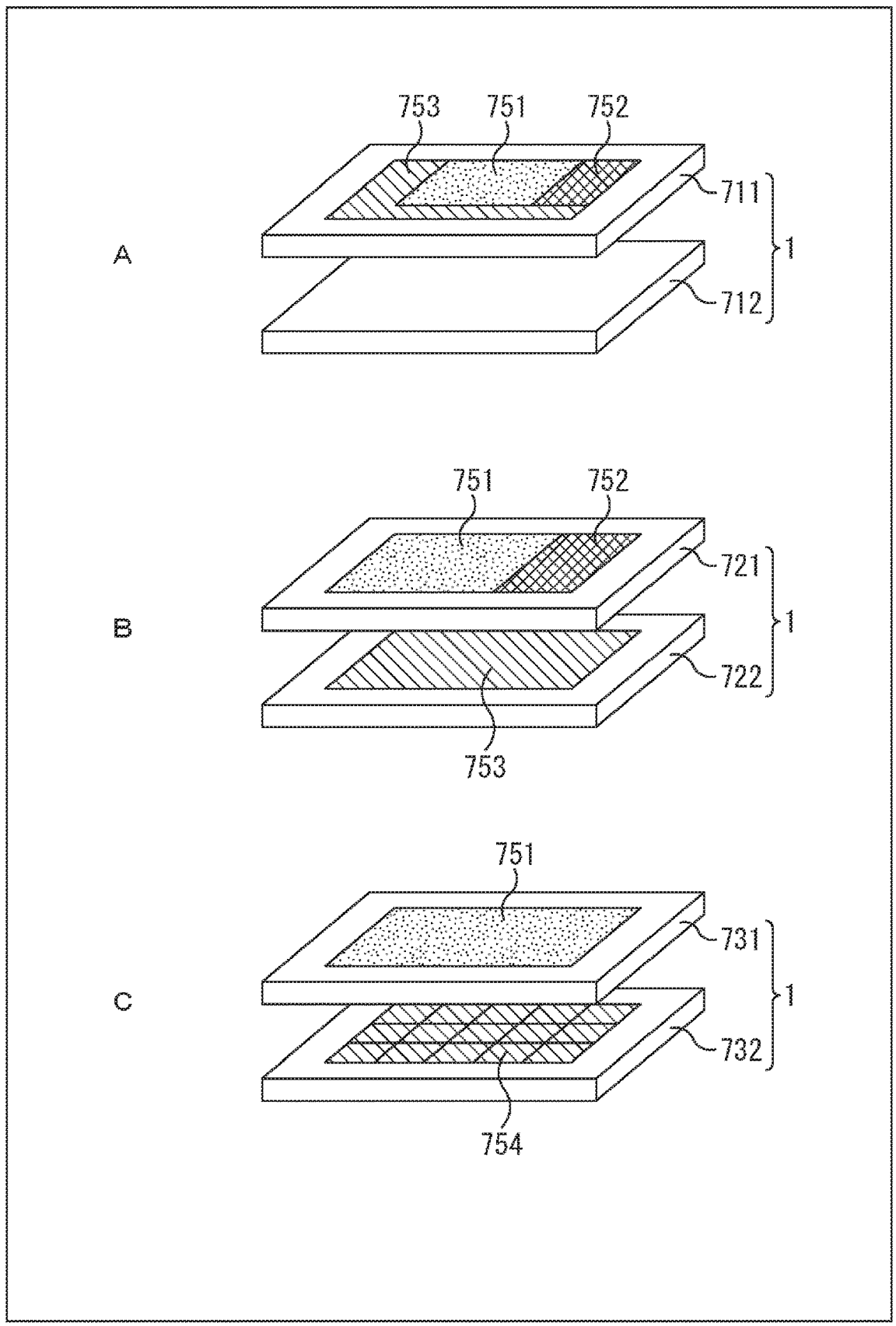
FIG. 19 is a diagram for explaining a substrate configuration of the light receiving element.

FIG. 19 shows the layout of the pixel 51 in which the unit configuration of the pair in which the PD 502 of a U shape and the read circuit 505 are arranged in the horizontal direction is laid out so that the unit configurations are repeatedly arranged in the horizontal direction. In addition, in the layout of the pixel 51 shown in FIG. 19, the same reference numerals are given to configurations having the same functions as those of the pixel 51 of FIG. 6, and the description thereof will be omitted as appropriate.

That is, FIG. 19 shows the layout of the pixel 51 in which a unit configuration including the PD 502A having a U shape FIG. 19, the U shape is turned upside down) and disposed so that the P+ semiconductor region 501A is sandwiched in a recess portion having an opening in a downward direction in the figure and the read circuit 505A paired with the PD 502A on a right side of the PD 502A, and a unit configuration including the PD 502B similarly having a U shape and disposed so that the P+ semiconductor region 501B is sandwiched in a recess portion having an opening in a downward direction and the read circuit 505B paired with the PD 502B on a right side of the PD 502B are repeatedly disposed adjacent to each other in the horizontal direction.

With such a layout, an interval P between the P+ semiconductor regions 501A and 501B is able to have half pitch with respect to the embodiment shown in FIGS. 6 to 11.

Figure 18:
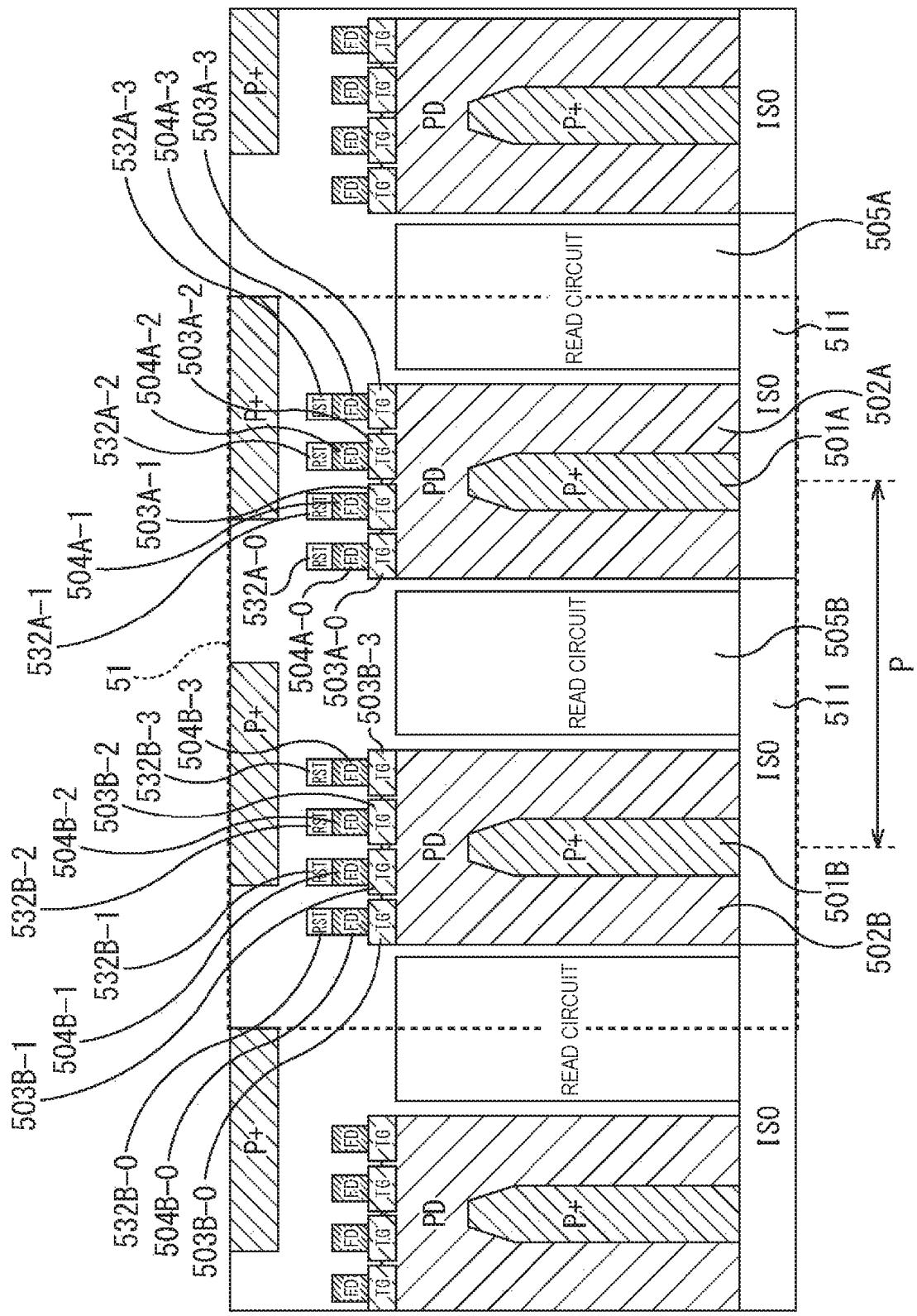
FIG. 18 is a diagram for explaining a layout configuration example of a third embodiment of a pixel configuring the light receiving element of the present disclosure.

In addition, in the pixel 51 of FIG. 18, the read circuit 505 and the PD 502 have a one-to-one configuration.

With the above configuration, also in the pixel 51 of FIG. 18, it is possible to perform the distance measurement with high accuracy and at high speed, even for the object that moves fast.

5. Substrate Configuration Example of Light Receiving Element

The light receiving element 1 using the pixel 51 of FIG. 6, FIG. 13 to FIG. 18 may adopt one of substrate configurations A to C of FIG. 19.

The substrate configuration A of FIG. 19 shows an example in which the light receiving element 1 includes one semiconductor substrate 711 and a support substrate 712 under the semiconductor substrate 711.

In this case, in an upper semiconductor substrate 711, a pixel array region 751 corresponding to the above-described pixel array unit 20, a control circuit 752 for controlling each pixel of the pixel array region 751, and a logic circuit 753 including the signal processing circuit of the pixel signal are formed.

The control circuit 752 includes the tap driving unit 21, the vertical driving unit 22, the horizontal driving unit 24, and the like described above. The logic circuit 753 includes the column processing unit 23 that performs the AD conversion process of the pixel signal and the like, and the signal processing unit 31 that performs a calibration process and the like.

Alternatively, as shown in the substrate configuration B of FIG. 19, the light receiving element 1 is able to have a configuration in Which a first semiconductor substrate 721 on which the pixel array region 751 and the control circuit 752 are formed and a second semiconductor substrate 722 on which the logic circuit 753 is formed are stacked. Note that the first semiconductor substrate 721 and the second semiconductor substrate 722 are electrically connected with each other by, for example, a through via or a Cu—Cu metallic bond.

Alternatively, as shown in the substrate configuration C of FIG. 19, the light receiving element 1 is able to have a configuration in which a first semiconductor substrate 731 on which only the pixel array region 751 is formed and a second semiconductor substrate 732 on which an area control circuit 754 provided with a control circuit that controls each pixel and a signal processing circuit that processes a pixel signal in units of one pixel or a plurality of pixels is formed are stacked. The first semiconductor substrate 731 and the second semiconductor substrate 732 are electrically connected with each other by, for example, a through via or a Cu—Cu metallic bond. In addition, in a case where the pixel array region 751 is formed on the first semiconductor substrate 731, only the read circuit 505 among the pixels 51 configuring the pixel array region 751 may be formed on the second semiconductor substrate 732.

According to the configuration in which the control circuit and the signal processing circuit are provided in units of one pixel or area as in the light receiving element 1 of the substrate configuration C of FIG. 19, it is possible to set an optimum driving timing or gain for each division control unit, and it is possible to acquire optimized distance information regardless of distance or reflectance. In addition, since it is possible to calculate the distance information by driving only a part of the region of the pixel array region 751 rather than the entire surface of the pixel array region, it is also possible to suppress power consumption according to an operation mode.

6. Configuration Example of Ranging Module

Figure 20:
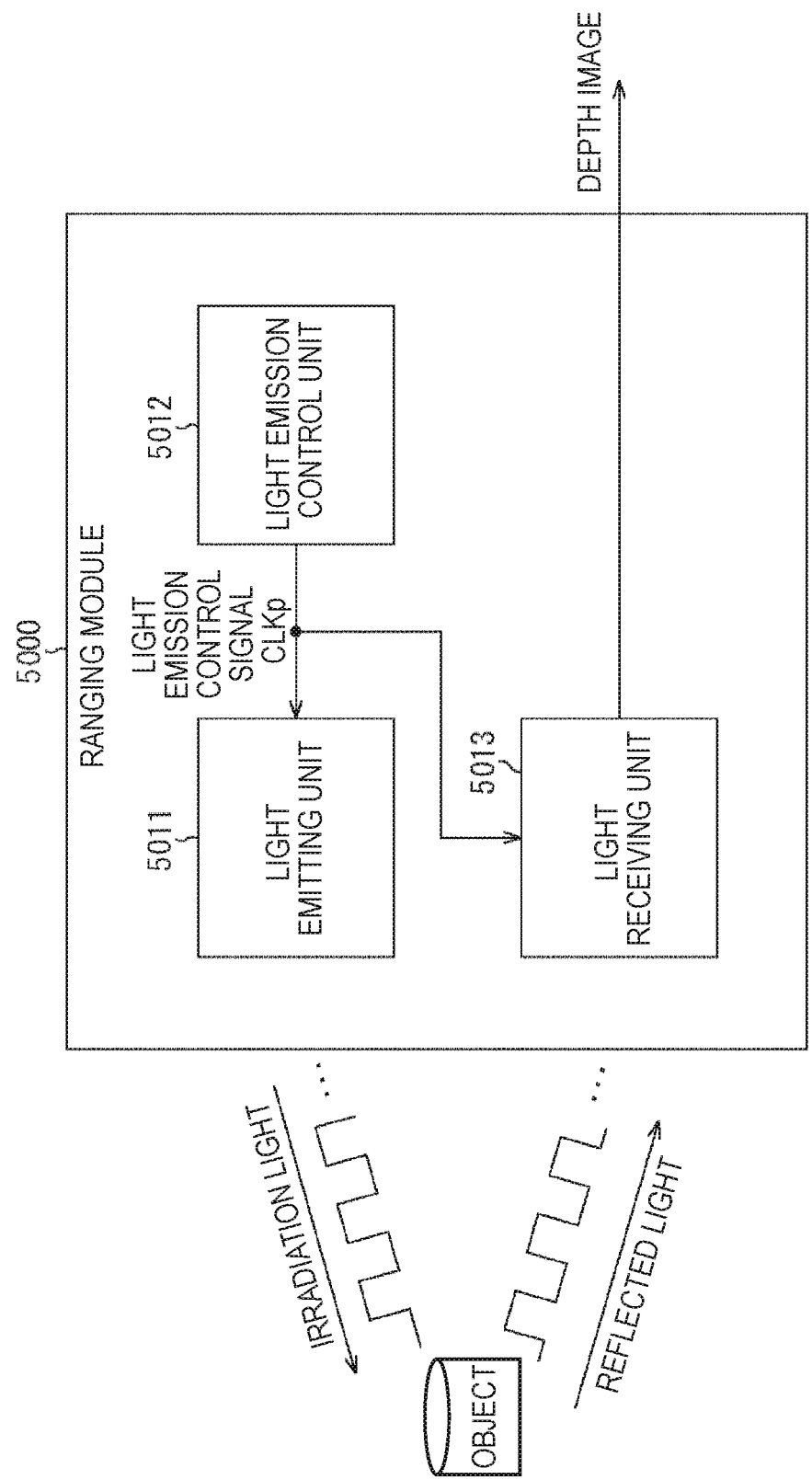
FIG. 20 is a block diagram illustrating a configuration example of a ranging module.

FIG. 20 is a block diagram illustrating the configuration example of the ranging module that outputs distance measurement information using the light receiving element 1 of FIG. 1.

The ranging module 5000 includes a light emitting unit 5011, a light emission control unit 5012, and a light receiving unit 5013.

The light emitting unit 5011 has a light source that emits light having a predetermined wavelength, and irradiates the object with irradiation light of which brightness periodically changes. For example, the light emitting unit 5011 has a light emitting diode that emits infrared light having a wavelength in a range of 780 nm to 1000 nm as a light source, and generates the irradiation light in synchronization with a light emission control signal CLKp of a rectangular wave supplied from the light emission control unit 5012.

Note that, the light emission control signal CLKp is not limited to the rectangular wave as long as the control signal CLKp is a periodic signal. For example, the light emission control signal CLKp may be a sine wave.

The light emission control unit 5012 supplies the light emission control signal CLKp to the light emitting unit 5011 and the light receiving unit 5013 and controls an irradiation timing of the irradiation light. A frequency of the light emission control signal CLKp is, for example, 20 megahertz (MHz). Note that, the frequency of the light emission control signal CLKp is not limited to 20 megahertz (MHz), and may be 5 megahertz (MHz) or the like.

The light receiving unit 5013 receives reflected light reflected from the object, calculates the distance information for each pixel according to a light reception result, generates a depth image in which the distance to the object is represented by a gradation value for each pixel, and outputs the depth image.

The above-described light receiving element 1 is used for the light receiving unit 5013, and for example, the light receiving element 1 serving as the light receiving unit 5013 calculates the distance information for each pixel from a signal intensity detected by each charge detection unit (N+ semiconductor region 71) of each of the signal extraction units 65-1 and 65-2 of each pixel 51 of the pixel array unit 20, on the basis of the light emission control signal CLKp.

As described above, the light receiving element 1 shown in FIG. 1 is able to be incorporated as the light receiving unit 5013 of the ranging module 5000 that obtains and outputs the information associated with the distance to the subject by the indirect ToF method. By adopting the light receiving element 1 of each of the embodiments described above, specifically, a light receiving element having improved pixel sensitivity as a rear surface irradiation type as the light receiving unit 5013 of the ranging module 5000, it is possible to improve a distance measurement characteristic of the ranging module.

7. Example of Application to Mobile Object

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 21:
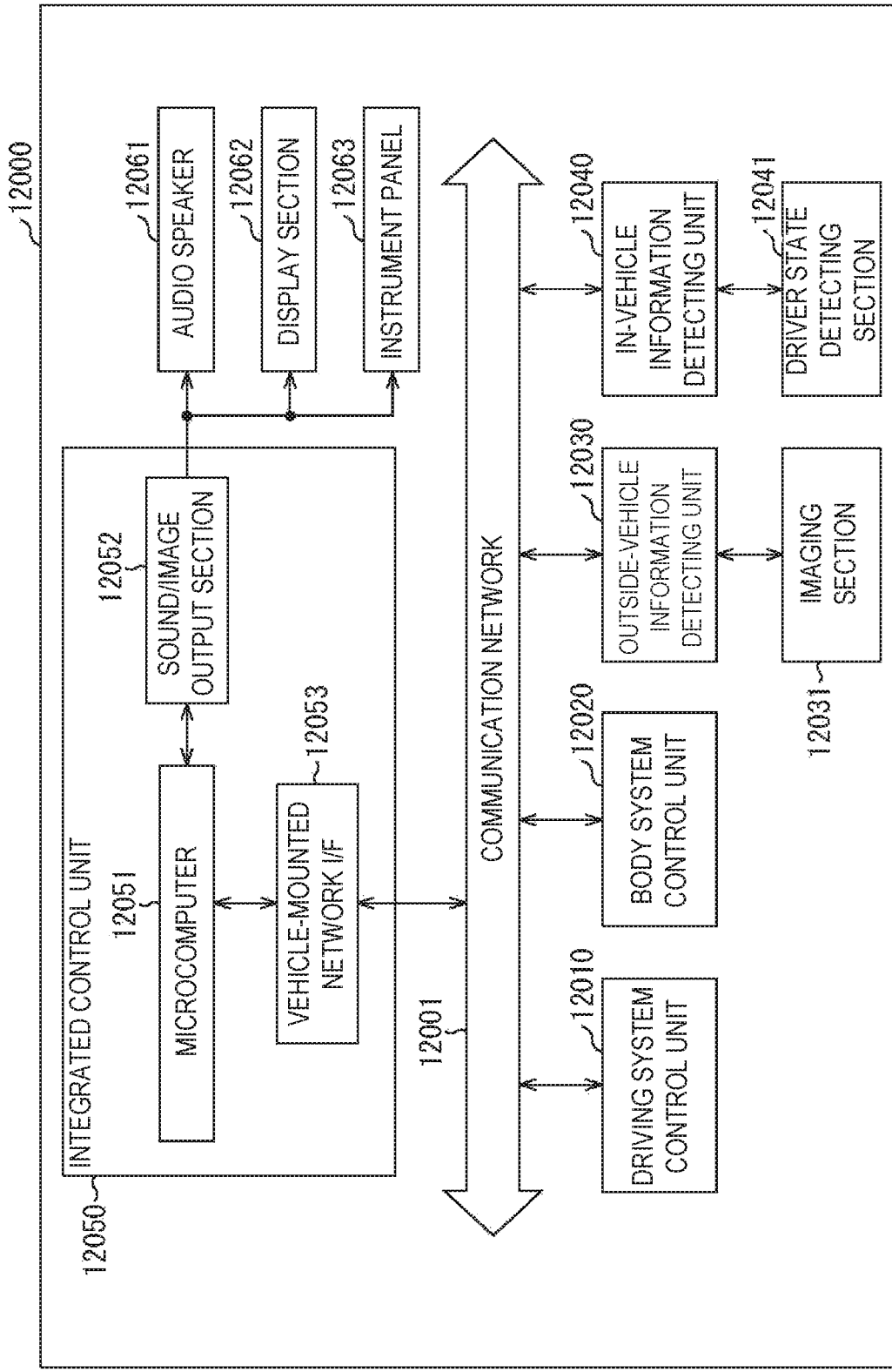
FIG. 21 is a block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an iN-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The iN-vehicle information detecting unit 12040 detects information about the inside of the vehicle. The iN-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the iN-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the iN-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the iN-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display or a head-up display.

Figure 22:
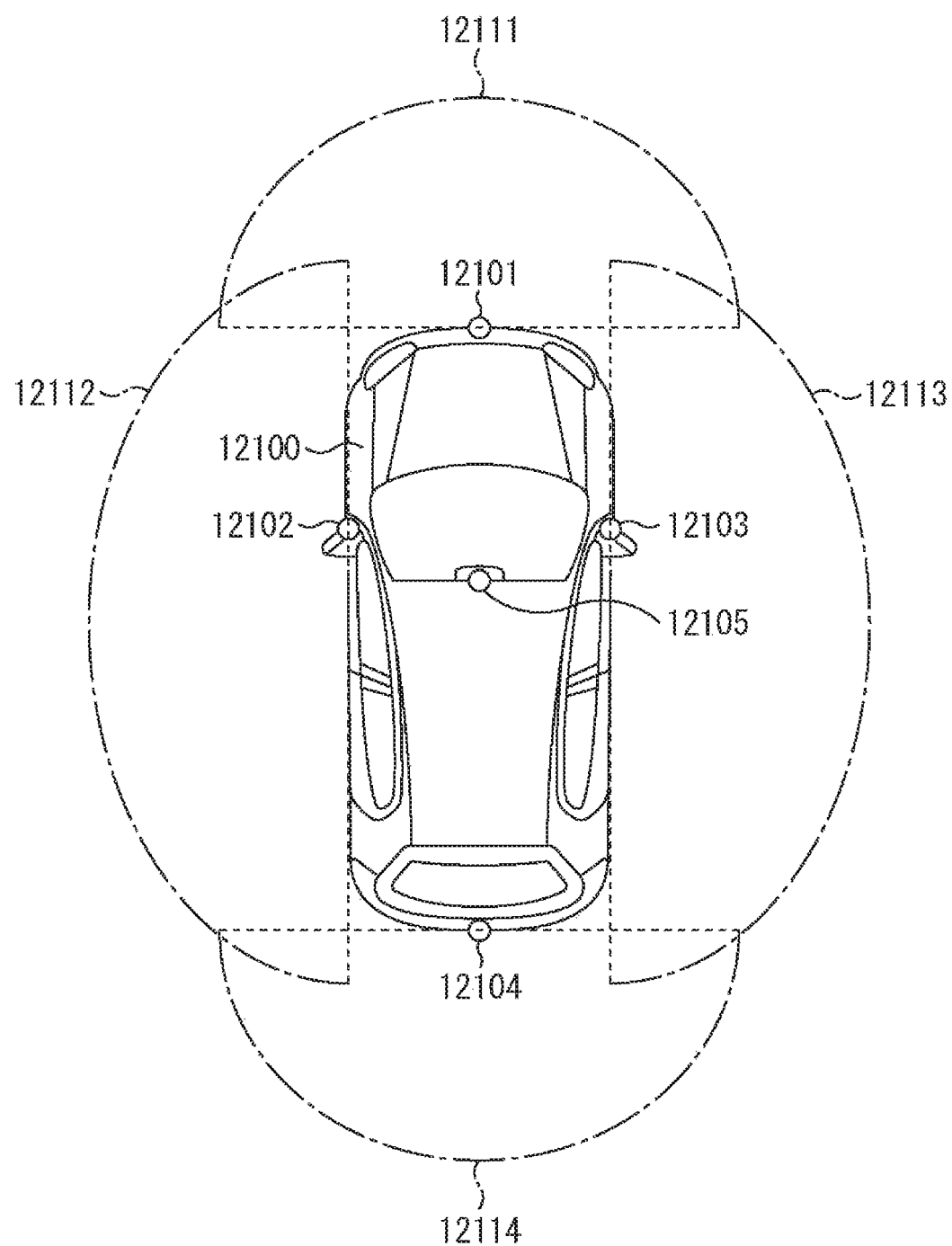
FIG. 22 is a diagram of assistance in explaining an example of installation positions of an outside-vehicle information detecting section and an imaging section.

FIG. 22 is a diagram depicting an example of the installation position of the imaging section 12031.

In FIG. 22, the vehicle 12100 includes the imaging sections 12101, 12102, 12103, 12104, and 12105, as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging section 12101 and the imaging section 12105 is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is able to be applied has been described above. The technology according to the present disclosure is able to be applied to the imaging section 12031 and the like among the above-described configurations. Specifically, the light receiving element 1 of FIG. 1 is able to be applied to the imaging section 12031. By applying the technology according to the present disclosure to the imaging section 12031, it is possible to speed up an arithmetic process relating to the distance measurement and improve a distance measurement characteristic for the fast moving object.

According to an embodiment of the present technology, in the CAPD sensor, the FD that stores the signal values of each of the four timings of the same phase (that is, Phase0) as that of the irradiation light for obtaining the phase shift amount θ of the projected light reflected from the object, the phase shifted by 90 degrees (Phase90), the phase shifted by 180 degrees (Phase180), and the phase shifted by 270 degrees (Phase270) is provided. Therefore, it is possible to collectively execute the calculation process of the signal values in each of the phases. Thus, it is possible to speed up the calculation process related to the distance measurement and improve the distance measurement characteristic for the object that moves fast.

In addition, the effects described in the present specification are merely examples and are not limited, and other effects may be provided.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

<1> A light receiving element including:

a first tap to which a first voltage is applied;

a second tap to Which a second voltage different from the first voltage is applied;

a first photoelectric conversion unit configured to detect a charge generated by photoelectric conversion according to a light amount of incident light in accordance with a voltage applied to the first tap;

a second photoelectric conversion unit configured to detect a charge generated by photoelectric conversion according to a light amount of the incident light in accordance with a voltage applied to the second tap;

a plurality of accumulation units configured to accumulate the charges generated by the first photoelectric conversion unit and the second photoelectric conversion unit;

a plurality of transmission units configured to transmit the charges generated by the first photoelectric conversion unit and the second photoelectric conversion unit to the plurality of accumulation units; and a calculation unit configured to execute calculation based on the charges accumulated in the plurality of accumulation units, which is the charge of one of the first photoelectric conversion unit and the second photoelectric conversion unit among the charges accumulated in the plurality of accumulation units.

<2> The light receiving element according to <1>, in which the incident light is reflected light of light projected onto an object, and the calculation unit calculates a distance to the object on the basis of the charges accumulated in the plurality of accumulation units.

<3> The light receiving element according to <2>, in which the projected light is light of which a brightness changes at a predetermined period, and each of the plurality of transmission units transmits the charge of one of the first photoelectric conversion unit and the second photoelectric conversion unit to the corresponding accumulation unit in a division period obtained by dividing the predetermined period into a plurality of periods.

<4> The light receiving element according to <3>, in which each of the plurality of transmission units transmits the charge of one of the first photoelectric conversion unit and the second photoelectric conversion unit to the accumulation unit associated with each of a plurality of division periods in each of the division periods obtained by dividing the predetermined period at an equal interval, and the calculation unit calculates the distance to the object on the basis of the charges accumulated in each of the plurality of accumulation units, which are the charge of one of the first photoelectric conversion unit and the second photoelectric conversion unit divided and transmitted in each of the plurality of division periods.

<5> The light receiving element according to <4>, in which the calculation unit calculates the distance to the object on the basis of a distribution ratio of the charges accumulated in each of the plurality of accumulation units, which is the charge of one of the first photoelectric conversion unit and the second photoelectric conversion unit divided and transmitted in each of the plurality of division periods.

<6> The light receiving element according to <5>, in which the calculation unit obtains a phase shift amount between the projected light of which the brightness changes at the predetermined period and the reflected light from the object which is the incident light, on the basis of the distribution ratio of the charges accumulated in each of the plurality of accumulation units, which is the charge of one of the first photoelectric conversion unit and the second photoelectric conversion unit divided and transmitted in each of the plurality of division periods, and calculates the distance to the object on the basis of the phase shift amount.

<7> The light receiving element according to any one of <1> to <6>, further including:

a first collection unit configured to collect the charge of the first photoelectric conversion unit between the first photoelectric conversion unit and the plurality of transmission units that transmit the charge of the first photoelectric conversion unit; and a second collection unit configured to collect the charge of the second photoelectric conversion unit between the second photoelectric conversion unit and the plurality of transmission units that transmit the charge of the second photoelectric conversion unit.

<8> The light receiving element according to <7>, in which, in a case in which switching is performed from a first state in which a predetermined transmission unit among the plurality of transmission units that transmit the charge of the first photoelectric conversion unit is turned on and a transmission unit other than the predetermined transmission unit among the plurality of transmission units that transmit the charge of the first photoelectric conversion unit is turned off to a second state in which another transmission unit different from the predetermined transmission unit is turned on and a transmission unit other than the other transmission unit is turned off, the first collection unit is turned off at a timing immediately before the switching and is turned on at a timing immediately after the switching, and in a case in which switching is performed from a third state in which a predetermined transmission unit among the plurality of transmission units that transmit the charge of the second photoelectric conversion unit is turned on and a transmission unit other than the predetermined transmission unit among the plurality of transmission units that transmit the charge of the second photoelectric conversion unit is turned off to a fourth state in which another transmission unit different from the predetermined transmission unit is turned on and a transmission unit other than the other transmission unit is turned off, the second collection unit is turned off at a timing immediately before the switching and is turned on at a timing immediately after the switching.

<9> The light receiving element according to <1>, in which the plurality of accumulation units that accumulate the charge of the first photoelectric conversion unit, the plurality of transmission units that transmit the charge of the first photoelectric conversion unit, the first photoelectric conversion unit, and the first tap, and the plurality of accumulation units that accumulate the charge of the second photoelectric conversion unit, the plurality of transmission units that transmit the charge of the second photoelectric conversion unit, the second photoelectric conversion unit, and the second tap are laid out symmetrically to face each other across the calculation unit as seen from an incident direction of the incident light.

<10> The light receiving element according to <9>, in which the plurality of accumulation units that accumulate the charge of the first photoelectric conversion unit, the plurality of transmission units that transmit the charge of the first photoelectric conversion unit, the first photoelectric conversion unit, and the first tap, and the plurality of accumulation units that accumulate the charge of the second photoelectric conversion unit, the plurality of transmission units that transmit the charge of the second photoelectric conversion unit, the second photoelectric conversion unit, and the second tap share one calculation unit.

<11> The light receiving element according to <1>, in which the plurality of accumulation units that accumulate the charge of the first photoelectric conversion unit, the plurality of transmission units that transmit the charge of the first photoelectric conversion unit, the first photoelectric conversion unit, and the first tap, and the plurality of accumulation units that accumulate the charge of the second photoelectric conversion unit, the plurality of transmission units that transmit the charge of the second photoelectric conversion unit, the second photoelectric conversion unit, and the second tap are laid out substantially symmetrically so that a first disposition direction in which the plurality of accumulation units that accumulate the charge of the first photoelectric conversion unit, the plurality of transmission units that transmit the charge of the first photoelectric conversion unit, the first photoelectric conversion unit, and the first tap are sequentially disposed, and a second disposition direction in which the plurality of accumulation units that accumulate the charge of the second photoelectric conversion unit, the plurality of transmission units that transmit the charge of the second photoelectric conversion unit, the second photoelectric conversion unit, and the second tap are sequentially disposed are substantially parallel to each other.

<12> The light receiving element according to <11>, in which each of the first photoelectric conversion unit and the second photoelectric conversion unit has a π shape, an opening of a concave portion of the π shape is on a side opposite to a position where the plurality of transmission units are disposed, and the first photoelectric conversion unit and the second photoelectric conversion unit are laid out so that the first tap and the second tap are sandwiched in the respective concave portions of the π shapes.

<13> The light receiving element according to <12>, in which the plurality of accumulation units that accumulate the charge of the first photoelectric conversion unit, the plurality of transmission units that transmit the charge of the first photoelectric conversion unit, the first photoelectric conversion unit, and the first tap, and the plurality of accumulation units that accumulate the charge of the second photoelectric conversion unit, the plurality of transmission units that transmit the charge of the second photoelectric conversion unit, the second photoelectric conversion unit, and the second tap share one calculation unit.

<14> The light receiving element according to <1>, in which each of the plurality of accumulation units that accumulate the charge of the first photoelectric conversion unit, the plurality of transmission units that transmit the charge of the first photoelectric conversion unit, the first photoelectric conversion unit, and the first tap, and the plurality of accumulation units that accumulate the charge of the second photoelectric conversion unit, the plurality of transmission units that transmit the charge of the second photoelectric conversion unit, the second photoelectric conversion unit, and the second tap has the calculation unit, a first unit in which a first calculation unit among the calculation units is disposed at a position adjacent perpendicularly to a first disposition direction in which the plurality of accumulation units that accumulate the charge of the first photoelectric conversion unit, the plurality of transmission units that transmit the charge of the first photoelectric conversion unit, the first photoelectric conversion unit, and the first tap are disposed in a same sequence, and a second unit in which a second calculation unit among the calculation units is disposed at a position adjacent perpendicularly to a second disposition direction in which the plurality of accumulation units that accumulate the charge of the second photoelectric conversion unit, the plurality of transmission units that transmit the charge of the second photoelectric conversion unit, the second photoelectric conversion unit, and the second tap are disposed in a same sequence are alternately disposed in a direction perpendicular to the first disposition direction and the second disposition direction, and the first disposition direction and the second disposition direction are substantially the same.

<15> The light receiving element according to <14>, in which each of the first photoelectric conversion unit and the second photoelectric conversion unit has a U shape, an opening is on a side opposite to a position where the plurality of transmission units are disposed, and the first photoelectric conversion unit and the second photoelectric conversion unit are laid out so that the first tap and the second tap are sandwiched in respective concave portions of the U shapes.

<16> A ranging module including:

a light receiving element including a first tap to which a first voltage is applied, a second tap to which a second voltage different from the first voltage is applied, a first photoelectric conversion unit configured to detect a charge generated by photoelectric conversion according to a voltage applied to the first tap and a light amount of incident light, a second photoelectric conversion unit configured to detect a charge generated by photoelectric conversion according to a voltage applied to the second tap and a light amount of incident light, a plurality of accumulation units configured to accumulate the charges generated by the first photoelectric conversion unit and the second photoelectric conversion unit, a plurality of transmission units configured to transmit the charges generated by the first photoelectric conversion unit and the second photoelectric conversion unit to the plurality of accumulation units, and a calculation unit configured to execute calculation based on the charges accumulated in the plurality of accumulation units, which is the charge of one of the first photoelectric conversion unit and the second photoelectric conversion unit among the charges accumulated in the plurality of accumulation units;

a light source configured to radiate irradiation light of which a brightness periodically changes; and a light emission control unit configured to control an irradiation timing of the irradiation light.

What is claimed is:

1. A light receiving element comprising:
a first tap to which a first voltage is applied;
a second tap to which a second voltage different from the first voltage is applied;
a first photoelectric conversion region configured to detect charge generated by photoelectric conversion according to an amount of incident light in accordance with a voltage applied to the first tap;
a second photoelectric conversion region configured to detect charge generated by photoelectric conversion according to the amount of incident light in accordance with a voltage applied to the second tap;
a plurality of floating diffusion regions configured to accumulate the charges generated by the first photoelectric conversion region and the second photoelectric conversion region;

a plurality of transmission transistors configured to transmit the charges generated by the first photoelectric conversion region and the second photoelectric conversion region to the plurality of floating diffusion regions; and a signal processor configured to execute calculation based on the charges accumulated in the plurality of floating diffusion regions, which is the charge of one of the first photoelectric conversion region and the second photoelectric conversion region among the charges accumulated in the plurality of floating diffusion regions, wherein the plurality of floating diffusion regions that accumulate the charge of the first photoelectric conversion region, the plurality of transmission transistors that transmit the charge of the first photoelectric conversion region, the first photoelectric conversion region, and the first tap, and the plurality of floating diffusion regions that accumulate the charge of the second photoelectric conversion region, the plurality of transmission transistors that transmit the charge of the second photoelectric conversion region, the second photoelectric conversion region, and the second tap are laid out symmetrically to face each other as seen from an incident direction of the incident light.

2. The light receiving element according to claim 1,
wherein the incident light is reflected light of light projected onto an object, and
the signal processor calculates a distance to the object on a basis of the charges accumulated in the plurality of floating diffusion regions.

3. The light receiving element according to claim 2,
wherein the projected light is light of which a brightness changes at a predetermined period, and
each of the plurality of transmission transistors transmits the charge of one of the first photoelectric conversion region and the second photoelectric conversion region to the corresponding floating diffusion region in a division period obtained by dividing the predetermined period into a plurality of periods.

4. The light receiving element according to claim 3,
wherein each of the plurality of transmission transistors transmits the charge of one of the first photoelectric conversion region and the second photoelectric conversion region to the floating diffusion region associated with each of a plurality of division periods in each of the division periods obtained by dividing the predetermined period at an equal interval, and
the signal processor calculates the distance to the object on a basis of the charges accumulated in each of the plurality of floating diffusion regions, which are the charge of one of the first photoelectric conversion region and the second photoelectric conversion region divided and transmitted in each of the plurality of division periods.

5. The light receiving element according to claim 4,
wherein the signal processor calculates the distance to the object on a basis of a distribution ratio of the charges accumulated in each of the plurality of floating diffusion regions, which is the charge of one of the first photoelectric conversion region and the second photoelectric conversion region divided and transmitted in each of the plurality of division periods.

6. The light receiving element according to claim 5,
wherein the signal processor obtains a phase shift amount between the projected light of which the brightness changes at the predetermined period and the reflected light from the object which is the incident light, on a basis of the distribution ratio of the charges accumulated in each of the plurality of floating diffusion regions, which is the charge of one of the first photoelectric conversion region and the second photoelectric conversion region divided and transmitted in each of the plurality of division periods, and calculates the distance to the object on a basis of the phase shift amount.

7. The light receiving element according to claim 1, further comprising:
a first collecting gate configured to collect the charge of the first photoelectric conversion region between the first photoelectric conversion region and the plurality of transmission transistors that transmit the charge of the first photoelectric conversion region; and
a second collecting gate configured to collect the charge of the second photoelectric conversion region between the second photoelectric conversion region and the plurality of transmission transistors that transmit the charge of the second photoelectric conversion region.

8. The light receiving element according to claim 7, wherein, in a case in which switching is performed from a first state in which a predetermined transmission transistor among the plurality of transmission transistors that transmit the charge of the first photoelectric conversion region is turned on and a transmission transistor other than the predetermined transmission transistor among the plurality of transmission transistors that transmit the charge of the first photoelectric conversion region is turned off to a second state in which another transmission transistor different from the predetermined transmission transistor is turned on and a transmission transistor other than the other transmission transistor is turned off, the first collecting gate is turned off at a timing immediately before the switching and is turned on at a timing immediately after the switching, and
wherein in a case in which switching is performed from a third state in which a predetermined transmission transistor among the plurality of transmission transistors that transmit the charge of the second photoelectric conversion region is turned on and a transmission transistor other than the predetermined transmission transistor among the plurality of transmission transistors that transmit the charge of the second photoelectric conversion region is turned off to a fourth state in which another transmission transistor different from the predetermined transmission transistor is turned on and a transmission transistor other than the other transmission transistor is turned off, the second collecting gate is turned off at a timing immediately before the switching and is turned on at a timing immediately after the switching.

9. The light receiving element according to claim 1, wherein the plurality of floating diffusion regions that accumulate the charge of the first photoelectric conversion region, the plurality of transmission transistors that transmit the charge of the first photoelectric conversion region, the first photoelectric conversion region, and the first tap, and the plurality of floating diffusion regions that accumulate the charge of the second photoelectric conversion region, the plurality of transmission transistors that transmit the charge of the second photoelectric conversion region, the second photoelectric conversion region, and the second tap share one read circuit.

10. The light receiving element according to claim 1, wherein each of the first photoelectric conversion region and the second photoelectric conversion region has a U shape, an opening is on a side opposite to a position where the plurality of transmission transistors are disposed, and the first photoelectric conversion region and the second photoelectric conversion region are laid out so that the first tap and the second tap are sandwiched in respective concave portions of the U shapes.

11. A light receiving element comprising:
a first tap to which a first voltage is applied;
a second tap to which a second voltage different from the first voltage is applied;
a first photoelectric conversion region configured to detect charge generated by photoelectric conversion according to an amount of incident light in accordance with a voltage applied to the first tap;
a second photoelectric conversion region configured to detect charge generated by photoelectric conversion according to the amount of incident light in accordance with a voltage applied to the second tap;
a plurality of floating diffusion regions configured to accumulate the charges generated by the first photoelectric conversion region and the second photoelectric conversion region;
a plurality of transmission transistors configured to transmit the charges generated by the first photoelectric conversion region and the second photoelectric conversion region to the plurality of floating diffusion regions; and
a signal processor configured to execute calculation based on the charges accumulated in the plurality of floating diffusion regions, which is the charge of one of the first photoelectric conversion region and the second photoelectric conversion region among the charges accumulated in the plurality of floating diffusion regions,
wherein the plurality of floating diffusion regions that accumulate the charge of the first photoelectric conversion region, the plurality of transmission transistors that transmit the charge of the first photoelectric conversion region, the first photoelectric conversion region, and the first tap, and the plurality of floating diffusion regions that accumulate the charge of the second photoelectric conversion region, the plurality of transmission transistors that transmit the charge of the second photoelectric conversion region, the second photoelectric conversion region, and the second tap are laid out substantially symmetrically so that a first disposition direction in which the plurality of floating diffusion regions that accumulate the charge of the first photoelectric conversion region, the plurality of transmission transistors that transmit the charge of the first photoelectric conversion region, the first photoelectric conversion region, and the first tap are sequentially disposed, and a second disposition direction in which the plurality of floating diffusion regions that accumulate the charge of the second photoelectric conversion region, the plurality of transmission transistors that transmit the charge of the second photoelectric conversion region, the second photoelectric conversion region, and the second tap are sequentially disposed are substantially parallel to each other.

12. The light receiving element according to claim 11, wherein each of the first photoelectric conversion region and the second photoelectric conversion region has a π shape, an opening of a concave portion of the π shape is on a side opposite to a position where the plurality of transmission transistors are disposed, and the first photoelectric conversion region and the second photoelectric conversion region are laid out so that the first tap and the second tap are sandwiched in the respective concave portions of the π shapes.

13. The light receiving element according to claim 12, wherein the plurality of floating diffusion regions that accumulate the charge of the first photoelectric conversion region, the plurality of transmission transistors that transmit the charge of the first photoelectric conversion region, the first photoelectric conversion region, and the first tap, and the plurality of floating diffusion regions that accumulate the charge of the second photoelectric conversion region, the plurality of transmission transistors that transmit the charge of the second photoelectric conversion region, the second photoelectric conversion region, and the second tap share a read circuit.

14. A ranging module comprising:
a light receiving element including:
   a first tap to which a first voltage is applied,
   a second tap to which a second voltage different from the first voltage is applied,
   a first photoelectric conversion region configured to detect charge generated by photoelectric conversion according to a voltage applied to the first tap and a light amount of incident light,
   a second photoelectric conversion region configured to detect charge generated by photoelectric conversion according to a voltage applied to the second tap and a light amount of incident light,
   a plurality of floating diffusion regions configured to accumulate the charges generated by the first photoelectric conversion region and the second photoelectric conversion region,
   a plurality of transmission transistors configured to transmit the charges generated by the first photoelectric conversion region and the second photoelectric conversion region to the plurality of floating diffusion regions, and
   a signal processor configured to execute calculation based on the charges accumulated in the plurality of floating diffusion regions, which is the charge of one of the first photoelectric conversion region and the second photoelectric conversion region among the charges accumulated in the plurality of floating diffusion regions;
a light source configured to radiate irradiation light of which a brightness periodically changes; and
a light emission control device configured to control an irradiation timing of the irradiation light,
wherein each of the first photoelectric conversion region and the second photoelectric conversion region has a U shape with a concave portion on a side opposite to a position where the plurality of transmission transistors are disposed, and
wherein the first photoelectric conversion region and the second photoelectric conversion region are laid out so that the first tap and the second tap are sandwiched in respective concave portions of the U shapes.

15. The ranging module according to claim 14, wherein the incident light is reflected light of light projected onto an object, and
the signal processor calculates a distance to the object on a basis of the charges accumulated in the plurality of floating diffusion regions.

16. The ranging module according to claim 15, wherein the projected light is light of which a brightness changes at a predetermined period, and
each of the plurality of transmission transistors transmits the charge of one of the first photoelectric conversion region and the second photoelectric conversion region to the corresponding floating diffusion region in a division period obtained by dividing the predetermined period into a plurality of periods.

17. The ranging module according to claim 16, wherein each of the plurality of transmission transistors transmits the charge of one of the first photoelectric conversion region and the second photoelectric conversion region to the floating diffusion region associated with each of a plurality of division periods in each of the division periods obtained by dividing the predetermined period at an equal interval, and
the signal processor calculates the distance to the object on a basis of the charges accumulated in each of the plurality of floating diffusion regions, which are the charge of one of the first photoelectric conversion region and the second photoelectric conversion region divided and transmitted in each of the plurality of division periods.

18. The ranging module according to claim 17, wherein the signal processor calculates the distance to the object on a basis of a distribution ratio of the charges accumulated in each of the plurality of floating diffusion regions, which is the charge of one of the first photoelectric conversion region and the second photoelectric conversion region divided and transmitted in each of the plurality of division periods.

19. The ranging module according to claim 18, wherein the signal processor obtains a phase shift amount between the projected light of which the brightness changes at the predetermined period and the reflected light from the object which is the incident light, on a basis of the distribution ratio of the charges accumulated in each of the plurality of floating diffusion regions, which is the charge of one of the first photoelectric conversion region and the second photoelectric conversion region divided and transmitted in each of the plurality of division periods, and calculates the distance to the object on a basis of the phase shift amount.

20. The ranging module according to claim 19, further comprising:
a first collecting gate configured to collect the charge of the first photoelectric conversion region between the first photoelectric conversion region and the plurality of transmission transistors that transmit the charge of the first photoelectric conversion region; and
a second collecting gate configured to collect the charge of the second photoelectric conversion region between the second photoelectric conversion region and the plurality of transmission transistors that transmit the charge of the second photoelectric conversion region.

* * * * *